(12) United States Patent
Oliver et al.

(10) Patent No.: US 7,323,703 B2
(45) Date of Patent: Jan. 29, 2008

(54) EUV LIGHT SOURCE

(75) Inventors: I. Roger Oliver, Gisborne (NZ); William N. Partlo, Poway, CA (US); Igor V. Fomenkov, San Diego, CA (US); Alexander I. Ershov, San Diego, CA (US); Norbert Bowering, San Diego, CA (US); John Viatella, San Diego, CA (US); David W. Myers, Poway, CA (US)

(73) Assignee: Cymer, Inc., San Diego, CA (US)

( * ) Notice: Subject to any disclaimer, the term of this patent is extended or adjusted under 35 U.S.C. 154(b) by 0 days.

(21) Appl. No.: 11/647,007

(22) Filed: Dec. 27, 2006

(65) Prior Publication Data

US 2007/0158596 A1    Jul. 12, 2007

Related U.S. Application Data

(60) Division of application No. 10/900,839, filed on Jul. 27, 2004, now Pat. No. 7,164,144, which is a continuation-in-part of application No. 10/803,526, filed on Mar. 17, 2004, now Pat. No. 7,087,914, which is a continuation-in-part of application No. 10/798,740, filed on Mar. 10, 2004, now Pat. No. 7,217,940.

(51) Int. Cl.
    *H01J 35/20*    (2006.01)
(52) U.S. Cl. .............................. 250/504 R; 250/493.1
(58) Field of Classification Search ............ 250/504 R, 250/493.1; 378/119
    See application file for complete search history.

(56) References Cited

U.S. PATENT DOCUMENTS

| | | | |
|---|---|---|---|
| 2,759,106 A | 8/1956 | Wolter | 250/53 |
| 3,150,483 A | 9/1964 | Mayfield et al. | 60/35.5 |
| 3,232,046 A | 2/1966 | Meyer | 50/35.5 |
| 3,279,176 A | 10/1966 | Boden | 60/202 |
| 3,746,870 A | 7/1973 | Demarest | 250/227 |
| 3,960,473 A | 6/1976 | Harris | 425/467 |
| 3,961,197 A | 6/1976 | Dawson | 250/493 |
| 3,969,628 A | 7/1976 | Roberts et al. | 250/402 |
| 4,042,848 A | 8/1977 | Lee | 313/231.6 |
| 4,088,966 A | 5/1978 | Samis | 313/231.5 |
| 4,143,275 A | 3/1979 | Mallozzi et al. | 250/503 |
| 4,162,160 A | 7/1979 | Witter | 75/246 |
| 4,203,393 A | 5/1980 | Giardini | 123/30 |

(Continued)

OTHER PUBLICATIONS

Andreev, et al., "Enhancement of laser/EUV conversion by shaped laser pulse interacting with Li-containted targets for EUV lithography", Proc. Of SPIE. 5196:128-136 (2004).

(Continued)

*Primary Examiner*—Kiet T. Nguyen
(74) *Attorney, Agent, or Firm*—William Cray

(57) ABSTRACT

An apparatus and method is described which may comprise a plasma produced extreme ultraviolet ("EUV") light source multilayer collector which may comprise a plasma formation chamber; a shell within the plasma formation chamber in the form of a collector shape having a focus; the shell having a sufficient size and thermal mass to carry operating heat away from the multilayer reflector and to radiate the heat from the surface of the shell on a side of the shell opposite from the focus. The material of the shell may comprise a material selected from a group which may comprise silicon carbide, silicon, Zerodur or ULE glass, aluminum, beryllium, molybdenum, copper and nickel. The apparatus and method may comprise at least one radiative heater directed at the shell to maintain the steady state temperature of the shell within a selected range of operating temperatures.

31 Claims, 16 Drawing Sheets

U.S. PATENT DOCUMENTS

| | | | | |
|---|---|---|---|---|
| 4,504,964 | A | 3/1985 | Cartz et al. | 378/119 |
| 4,536,884 | A | 8/1985 | Weiss et al. | 378/119 |
| 4,538,291 | A | 8/1985 | Iwamatsu | 378/119 |
| 4,596,030 | A | 6/1986 | Herziger et al. | 378/119 |
| 4,618,971 | A | 10/1986 | Weiss et al. | 378/34 |
| 4,626,193 | A | 12/1986 | Gann | 431/71 |
| 4,633,492 | A | 12/1986 | Weiss et al. | 378/119 |
| 4,635,282 | A | 1/1987 | Okada et al. | 378/34 |
| 4,751,723 | A | 6/1988 | Gupta et al. | 378/119 |
| 4,752,946 | A | 6/1988 | Gupta et al. | 378/119 |
| 4,837,794 | A | 6/1989 | Riordan et al. | 378/119 |
| 5,023,897 | A | 6/1991 | Neff et al. | 378/122 |
| 5,027,076 | A | 6/1991 | Horsley et al. | 324/674 |
| 5,102,776 | A | 4/1992 | Hammer et al. | 430/311 |
| 5,126,638 | A | 6/1992 | Dethlefsen | 315/326 |
| 5,142,166 | A | 8/1992 | Birx | 307/419 |
| 5,313,481 | A | 5/1994 | Cook et al. | 372/37 |
| 5,411,224 | A | 5/1995 | Dearman et al. | 244/53 |
| 5,448,580 | A | 9/1995 | Birx et al. | 372/38 |
| 5,504,795 | A | 4/1996 | McGeoch | 378/119 |
| 5,729,562 | A | 3/1998 | Birx et al. | 372/38 |
| 5,763,930 | A | 6/1998 | Partlo | 250/504 |
| 5,866,871 | A | 2/1999 | Birx | 219/121 |
| 5,936,988 | A | 8/1999 | Partlo et al. | 372/38 |
| 5,963,616 | A | 10/1999 | Silfvast et al. | 378/122 |
| 6,031,241 | A | 2/2000 | Silfvast et al. | 250/504 |
| 6,039,850 | A | 3/2000 | Schulz | 204/192.15 |
| 6,051,841 | A | 4/2000 | Partlo | 250/504 |
| 6,064,072 | A | 5/2000 | Partlo et al. | 250/504 |
| 6,172,324 | B1 | 1/2001 | Birx | 219/121.57 |
| 6,195,272 | B1 | 2/2001 | Pascente | 363/21 |
| 6,452,199 | B1 | 9/2002 | Partlo et al. | 250/504 |
| 6,566,667 | B1 | 5/2003 | Partlo et al. | 250/504 |
| 6,566,668 | B2 | 5/2003 | Rauch et al. | 250/504 |
| 6,576,912 | B2 | 6/2003 | Visser et al. | 250/492.2 |
| 6,586,757 | B2 | 7/2003 | Melnychuk et al. | 250/504 |
| 6,590,959 | B2 | 7/2003 | Kansaka et al. | 378/199 |
| 6,744,060 | B2 | 6/2004 | Ness et al. | 315/111.01 |
| 6,804,327 | B2 | 10/2004 | Schriever et al. | 378/119 |
| 6,815,700 | B2 | 11/2004 | Melnychuk et al. | 250/504 |
| 6,822,251 | B1 | 11/2004 | Arenberg et al. | 250/504 |
| 6,894,298 | B2 | 5/2005 | Ahmad et al. | 250/504 |
| 6,904,073 | B2 | 6/2005 | Yager et al. | 372/57 |
| 7,087,914 | B2 | 8/2006 | Akins et al. | 250/504 |
| 2006/0072084 | A1* | 4/2006 | Van Herpen et al. | 355/30 |

OTHER PUBLICATIONS

Apruzese, J.P., "X-Ray Laser Research Using Z Pinches," *Am. Inst. of Phys.* 399-403, (1994).

Bollanti, et al., "Compact Three Electrodes Excimer Laser IANUS for a POPA Optical System," *SPIE Proc.* (2206)144-153, (1994).

Bollanti, et al., "Ianus, the three-electrode excimer laser," *App. Phys. B (Lasers & Optics)* 66(4):401-406, (1998).

Choi, et al., "A $10^{13}$ A/s High Energy Density Micro Discharge Radiation Source," *B. Radiation Characteristics*, p. 287-290.

Choi, et al., "Fast pulsed hollow cathode capillary discharge device," *Rev. of Sci. Instrum,* 69(9):3118-3122 (1998).

Fomenkov, et al., "Characterization of a 13.5nm Source for EUV Lithography based on a Dense Plasma Focus and Lithium Emission." Sematech Intl. Workshop on EUV Lithography (Oct. 1999).

Hansson, et al., "Xenon liquid jet laser-plasma source for EUV lithography," Emerging Lithographic Technologies IV, *Proc. Of SPIE*, vol. 3997:729-732 (2000).

Kato, Yasuo, "Electrode Lifetimes in a Plasma Focus Soft X-Ray Source," *J. Appl. Phys.* (33) Pt. 1, No. 8:4742-4744 (1991).

Kato, et al., "Plasma focus x-ray source for lithography," *Am. Vac. Sci. Tech. B.,* 6(1): 195-198 (1988).

Lebert, et al., "Soft x-ray emission of laser-produced plasmas using a low-debris cryogenic nitrogen target,"*J. App. Phys.*, 84(6):3419-3421 (1998).

Lebert, et al., "A gas discharge based radiation source for EUV-lithography," Intl.Conf. Micro and Nano-Engineering 98 (Sep. 22-24, 1998) Leuven, Belgium.

Lebert, et al., "Investigation of pinch plasmas with plasma parameters promising ASE," Inst. Phys. Conf. Ser No. 125: Section 9, pp. 411-415 (1992) Schiersee, Germany.

Lebert, et al., "Comparison of laser produced and gas discharge based EUV sources for different applications," Intl. Conf. Micro- and Nano-Engineering 98 (Sep. 22-24, 1998) Leuven, Belgium.

Lee, Ja H., "Production of dense plasmas in hypocyloidal pinch apparatus," *The Phys. Of Fluids*, 20(2):313-321 (1977).

Lewis, Ciaran L.S., "Status of Collision-Pumped X-ray Lasers," *Am Inst. Phys.* pp. 9-16 (1994).

Malmqvist, et al., "Liquid-jet target for laser-plasma soft x-ray generation," *Am. Inst. Phys.* 67(12):4150-4153 1996).

Mather, et al., "Stability of the Dense Plasma Focus," *Phys. Of Fluids*, 12(11):2343-2347 (1969).

Mayo, et al., "A magnetized coaxial source facility for the generation of energetic plasma flows," *Sci. Technol.* vol. 4:pp. 47-55 (1994).

Mayo, et al., "Initial Results on high enthalpy plasma generation in a magnetized coaxial source," *Fusion Tech* vol. 26:1221-1225 (1994).

Nilsen, et al., "Analysis of resonantly photopumped Na-Ne x-ray-laser scheme," *Am Phys. Soc.* 44(7):4591-4597 (1991).

Orme, et al., "Electrostatic charging and deflection of nonconventional droplet streams formed from capillary stream breakup," *Physics of Fluids,* 12(9):2224-2235, (Sep. 2000).

Orme, et al., "Charged Molten Metal Droplet Deposition As a Direct Write Technology", MRS 2000 Spring Meeting, San Francisco, (Apr. 2000).

Pant, et al., "Behavior of expanding laser produced plasma in a magnetic field," *Physica Sripta*, T75:104-111, (1998).

Partlo, et al., "EUV (13.5nm) Light Generation Using a Dense Plasma Focus Device," *SPIE Proc. On Emerging Lithographic Technologies III.* Vol. 3676, 846-858 (Mar. 1999).

Porter, et al., "Demonstration of Population Inversion by Resonant Photopumping in a Neon Gas Cell Irradiated by a Sodium Z Pinch," Phys. Rev. Let., 68(6):796-799. (Feb. 1992).

Price, Robert H., "X-Ray Microscopy using Grazing Incidence Reflection Optics," *Am. Inst. Physl.* , pp. 189-199, (1981).

Qi, et al., "Flouorescence in Mg IX emission at 48.340 Å from Mg pinch plasmas photopumped by A1 X1 line radiation at 48.338 Å, " *The Am. Phys. Soc.,* 47(3):2253-2263 (Mar. 1993).

Scheuer, et al., "A Magnetically-Nozzled, Quasi-Steady, Multimegawatt, Coaxial Plasma Thruster," *IEEE:Transactions on Plasma Science,* 22(6) (Dec. 1994).

Schriever, et al., "Laser-produced lithium plasma as a narrow-band extended ultraviolet radiation source for photoelectron spectroscopy." App. Optics, 37(7):1243-1248, (Mar. 1998).

Schriever, et al., "Narrowband laser produced extreme ultraviolet sources adapted to silicon/molybdenum multilayer optics" J of Ann Phys 83(9):4566-4571 (May 1998).

Silfvast, et al., "High-power plasma discharge source at 13.5 nm and 11.4 nm for EUV lithography," *SPIE,* vol. 3676:272-275, (Mar. 1999).

Silfvast, et al., "Lithium hydride capillary discharge creates x-ray plasma at 13.5 namometer," *Laser Focus World*, p. 13. (Mar. 1997).

Tillack, et al., "Magnetic Confinement of an Expanding Laser-Produced Plasma", UC San Diego, Center for Energy Research, UCSD Report & Abramova—Tornado Trap.

Wilhein, et al., "A slit grating spectrograph for quantitative soft x-ray spectroscopy," Am. Inst. Of Phys. Rev. of Sci. Instrum., 70(3):1694-1699, (Mar. 1999).

Wu, et al., "The vacuum Spark and Spherical Pinch X-ray/EUV Point Sources," *SPIE, Conf. On Emerging Tech. III,* Santa Clara, Ca, vol. 3676:410-420, (Mar. 1999).

Zombeck, M.V., "Astrophysical Observations with High Resolution X-ray Telescope," *Am. Inst. Of Phys.,* pp. 200-209, (1981).

\* cited by examiner

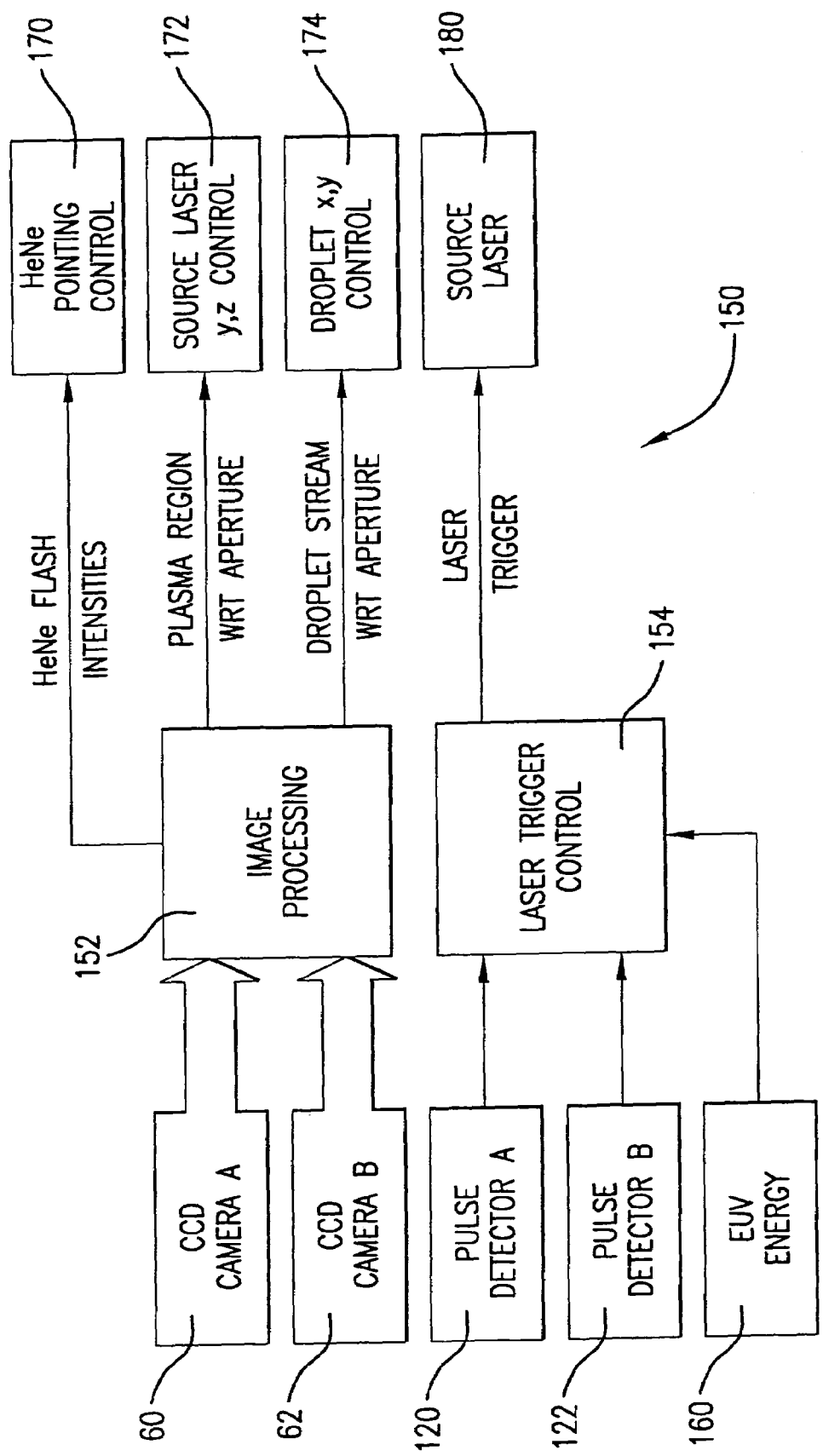

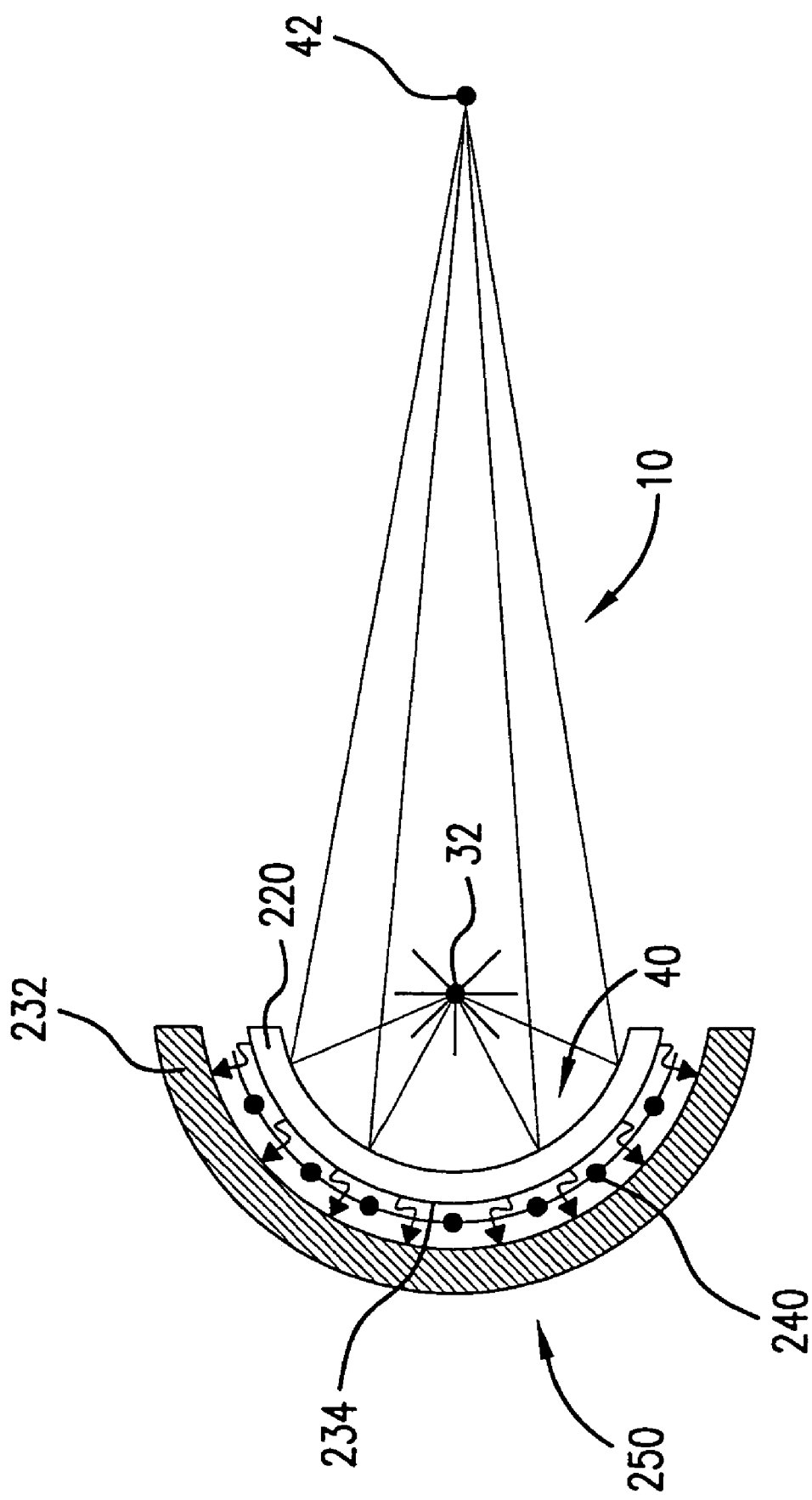

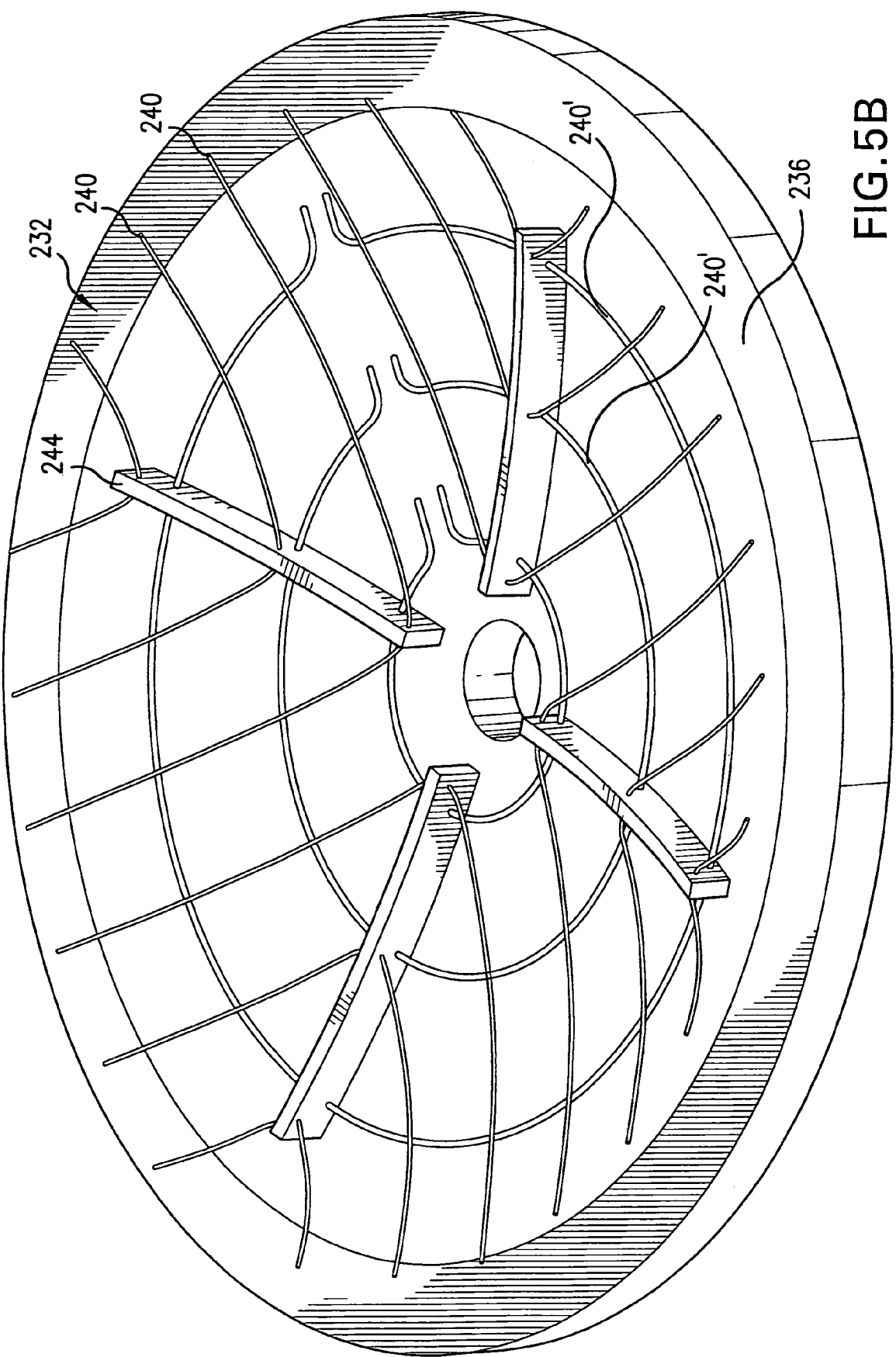

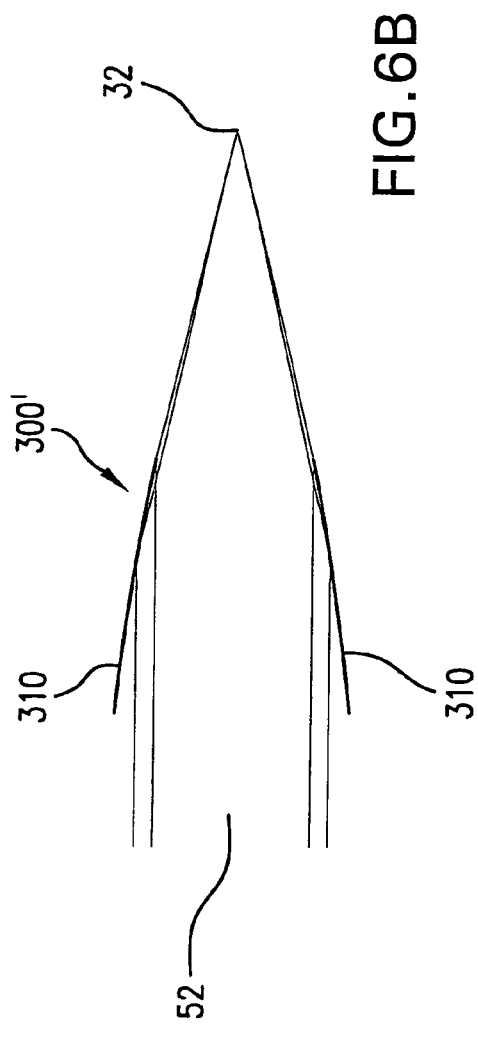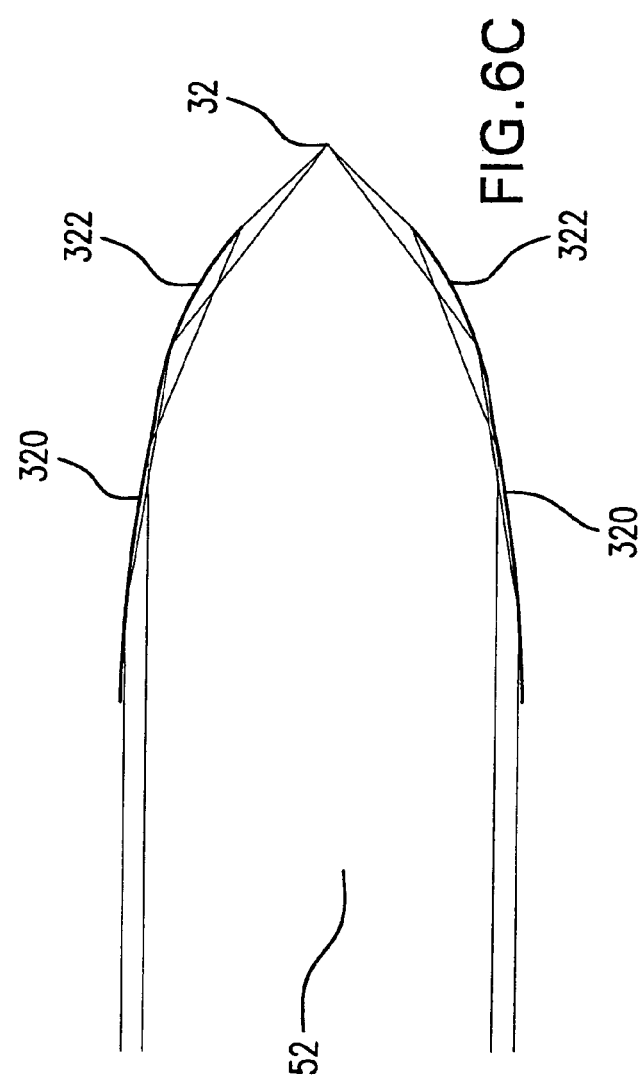

EUV LIGHT SOURCE

RELATED APPLICATIONS

The present application is a divisional of U.S. application Ser. No. 10/900,839, filed Jul. 27, 2004 now U.S. Pat. No. 7,164,144, which is a continuation-in-part to co-pending application Ser. No. 10/803,526, entitled A HIGH REPETITION RATE LASER PRODUCED PLASMA EUV LIGHT SOURCE, filed on Mar. 17, 2004 now U.S. Pat. No. 7,087,914, and Ser. No. 10/798,740 now U.S. Pat. No. 7,217,940, entitled COLLECTOR FOR EUV LIGHT SOURCE, filed on Mar. 10, 2004, and is related to Ser. No. 10/742,233, entitled DISCHARGE PRODUCED PLASMA EUV LIGHT SOURCE, filed on Dec. 18, 2003, and Ser. No. 10/409,254, entitled EXTREME ULTRAVIOLET LIGHT SOURCE, filed on Apr. 8, 2003, and Ser. No. 10/189,824, entitled PLASMA FOCUS LIGHT SOURCE WITH IMPROVED PULSE POWER SYSTEM, filed on Jul. 3, 2002, all of which are assigned to the common assignee of the present application, the disclosures of each of which are hereby incorporated by reference.

FIELD OF THE INVENTION

The present invention relates to the generation of EUV light, e.g., at the power levels required for EUV integrated circuit lithography with the required dose stability and other parameters that will be necessary for such uses.

BACKGROUND OF THE INVENTION

As discussed in the above referenced co-pending applications one aspect of an EUV light source operating at ten to twenty thousand pulses of EUV light per second, or even higher, and using, e.g., a moving target, e.g., a mass limited droplet, is the ability to track the position and timing of the targets and their respective arrival at a desired plasma initiation site. This involves, e.g., determining a spot in 3D space which is imaged by an EUV light collector to an intermediate focus (IF), e.g., at an exit point for the EUV light from an EUV light generation chamber containing the collector and the desired initiation site. Also as discussed in the above referenced co-pending applications a droplet delivery system, including, e.g., a droplet generator and aiming system, needs to be aligned so that the droplets are projected through or fall through (in the case of a gravity feed) the spot that constitutes the desired plasma initiation site, corresponding to the focus of the collector and a small area around this focus, e.g., ±10 µm in which EUV generated from a laser produced plasma will still be adequately focused to the intermediate focus of the system, a so-called desired plasma initiation region around the desired plasma initiation site. Also required is to be able to fire the laser to have the drive laser beam intersect the target droplet at the desired plasma initiation site, i.e., when a droplet arrives exactly at the desired initiation site. It will be understood, as noted, that the desired initiation site may vary slightly from the precise focus of the collector, e.g., at a first focus of an elliptical collector mirror having a second focus comprising the intermediate focus of the light source system, e.g., by about 10 µm for, e.g., droplets of about 10 µm-40 µm in diameter and still be in focus enough for adequate collection. Therefore, a function of the tracking sub-system is not only to determine when to fire the laser(s) but at what selected plasma initiation site if not the desired plasma initiation site at the true focus, and the corrections necessary for the delivery system to, in the meantime, bring the target delivery to the desired plasma initiation site. The system may also determine that the target droplet is not on a track to arrive at the desired plasma initiation site and that, therefore there will not be any effective generation of EUV light that will arrive at the intermediate focus, and that therefore the laser should not be fired while the target droplets are returned to a proper target track to intersect the desired EUV plasma initiation site. Alternatively, laser firing could be allowed to continue even though adequate EUV light is not being collected while the target positioning is ongoing.

It will be understood that, while "desired plasma initiation site" as used herein is the focus of the collector, some area around the focus of the collector in which aiming the drive laser beam at a so-called selected plasma initiation site that is slightly off of the collector focus, can still be effective for generating an effective amount of EUV light at the intermediate focus ("the desired plasma initiation region"). "Selected plasma initiation sites" that are not on the collector focus, but within the desired plasma initiation region, having an acceptable distance error in both the x and y planes, as defined below, may occur. In the event that the laser will continue to be fired even if the selected plasma initiation site is outside the desired plasma initiation region, then selected plasma initiation sites may occur outside the desired plasma initiation region also.

Aspects of performing these functions have been discussed in the above referenced co-pending applications. Applicants herein propose certain improved apparatus and methods for accomplishing these functions.

Applicants have developed unique approaches to place the targets, e.g., individual Li droplet targets in the right position in 3D space, aiming a laser beam at a droplet position and firing the laser at the right moment in order to better enable operation of EUV LPP source, according to aspects of embodiments of the present invention. The irradiation of the target, e.g., a target droplet, heats the droplet sufficiently to cause the formation of a plasma through, e.g., evaporation/ablation and photons in the laser beam strip off electrons forming ions of evaporated target metal atoms in the plasma, and in this sense the target is ignited at a plasma initiation site, using the meaning of ignite or ignition to mean the subjecting of the target to intense heat and/or to heat up or excite, and generally meaning the formation of the plasma from the irradiated target due to the impartation of the heat (energy) from a drive laser beam intersecting the target and igniting the target to form a resultant plasma, that in turn produces EUV radiation. The use of the term ignition in the above referenced applications will be understood to have this meaning. Another meaning for ignition is the heating of a plasma to a temperature high enough to sustain nuclear fusion. While likely that such a temperature is attained in the plasma formation according to aspects of the present invention, which, however, involves none of the attempts to confine the plasma so formed according to aspects of the present invention sufficient to induce and/or sustain fusion, the conception of an ignition of a plasma according to aspects of an embodiment of the present invention has a similar meaning as used in the above referenced applications. In the present application the same concept is expressed by the term "plasma initiation" and "plasma initiation site," meaning the irradiation of the target causes the plasma to form "plasma initiation" and this occurs or is desired to occur at some "plasma initiation site."

Lithium for use as a target as discussed in above referenced co-pending applications likely will have at least some impurities in it. Even levels of impurities in the parts per million range, over time, can cause unwanted and damaging depositions within an LPP EUV chamber, e.g., on the collector optics and/or various chamber windows. These impurities, contained in an LPP target droplet of liquid lithium, after plasma initiation will be deposited, e.g., on the collector mirror. Since many of these impurities have much higher boiling temperatures than the, e.g., 400-500° C. proposed collector temperature, e.g., to evaporate the deposition of lithium itself, it is more difficult to remove these impurities from the collector using the previously suggested evaporation techniques. Applicants in the present application suggest a way of dealing with this problem in previously proposed LPP and/or DPP EUV chamber components, e.g., the optical components.

As discussed in prior co-pending applications referenced above, the collector needs to operate at an elevated temperature (e.g., at least at about a range of 400-500° C.), e.g., in order to evaporate Li from its reflective surface and maintain its reflectivity. Applicants propose in the present application apparatus and methods to maintain a stable and uniform temperature range across the optics of the collector over which its performance is able to meet required specifications, e.g., the avoidance of collector distortion due to maintenance of the elevated temperature.

Utilization of a solid state laser, e.g., a Nd:YAG laser to drive a LPP EUV source, with 1064 nm laser light is often doubled, has been known to employ doubled, tripled, etc. frequencies, e.g., to possibly achieve higher conversion efficiency at smaller wavelengths produced at the first harmonic generation ("FHG") and second harmonic generation ("SHG"). This has been based on accessing a higher density plasma layer with the shorter wavelength higher harmonics, such that more source atoms are available for excitation and subsequent emission. In generating the higher laser harmonics, however, a large fraction (perhaps 30-50% for SHG and 80% for FHG to 266 nm) is lost because it is not converted in the nonlinear crystals.

Applicants have also developed, according to aspects of embodiments of the present invention ways to achieve higher conversion efficiency from laser energy converted to EUV radiation, and which allows extremely precise control of the initial density scale length, which will allow precision optimization of the laser deposition of energy into a target, e.g., a droplet, for improved conversion energy output ratios.

One of the problems in focusing optics for EUV LPP sources with Li or similar elements is a contamination and degradation of the optics due to contamination from Li or other elements. Applicants have developed according to aspects of embodiments of the present invention utilizations of grazing incidence optics or other EUV radiation collection optics for the improvement of conversion efficiency.

Also an issue in systems of the type of aspects of an embodiment of the present invention relates to the need for protecting optics other than the collector, e.g., windows and focusing optics, which may be combined, e.g., in introducing the drive laser-beam into the EUV light source production chamber, which are addressed in the present application.

SUMMARY OF THE INVENTION

An apparatus and method is described which may comprise a plasma produced extreme ultraviolet ("EUV") light source multilayer collector which may comprise a plasma formation chamber; a shell within the plasma formation chamber in the form of a collector shape having a focus; the shell having a sufficient size and thermal mass to carry operating heat away from the multilayer reflector and to radiate the heat from the surface of the shell on a side of the shell opposite from the focus. The material of the shell may comprise a material selected from a group which may comprise silicon carbide, silicon, Zerodur or ULE glass, aluminum, beryllium, molybdenum, copper and nickel. The apparatus and method may comprise at least one radiative heater directed at the shell to maintain the steady state temperature of the shell within a selected range of operating temperatures. The temperatures within the range of temperatures may be sufficient to evaporate plasma generation target material from an outer surface of the collector. The apparatus and method may comprise a heat sink adjacent the shell on the side of the shell opposite from the focus absorbing heat radiated from the facing surface of the shell. The heat sink may form a part of a heat exchanger transferring heat to a heat transfer fluid supplied from external to the chamber. The method and apparatus may comprise the method of producing a plasma produced extreme ultraviolet ("EUV") light source comprising utilizing a collector which may comprise a plasma formation chamber; a shell within the plasma formation chamber in the form of a collector shape having a focus; a multilayer stack forming a normal angle of incidence reflector or a grazing angle of incidence reflector in physical and thermal communication with the shell on a side of the shell facing the focus; and including in the shell a sufficient size and thermal mass to carry operating heat away from the multilayer reflector and to radiate the heat from the surface of the shell on a side of the shell opposite from the focus. The apparatus and method may comprise a plasma produced extreme ultraviolet ("EUV") light source collector which may comprise a plasma formation chamber; a shell within the plasma formation chamber in the form of a collector shape having a focus; a multilayer stack forming a normal angle of incidence reflector or a grazing angle of incidence reflector in physical and thermal communication with the shell on a side of the shell facing the focus; a heat sink adjacent the shell on the side of the shell opposite from the focus in radiative thermal communication with the shell. The shell may comprise a substrate for the multilayer stack. The shell may have a sufficient size and thermal mass to carry operating heat away from the multilayer reflector and to radiate the heat from the surface of the shell on a side of the shell opposite from the focus. The apparatus and method may comprise a heating element intermediate the shell and the heat sink. The heating element may comprise a zonal heater differentially heating the shell.

BRIEF DESCRIPTION OF THE DRAWINGS

FIG. 3A shows a block diagram of an EUV metrology system according to aspects of an embodiment of the present invention;

FIGS. 5A-5C show an alternative to FIG. 5 according to aspects of an embodiment of the present invention;

FIGS. 6A-6D show further aspects of an embodiment of an LPP EUV system according to aspects of an embodiment of the present invention;

DETAILED DESCRIPTION OF PREFERRED EMBODIMENTS

Figure 1:
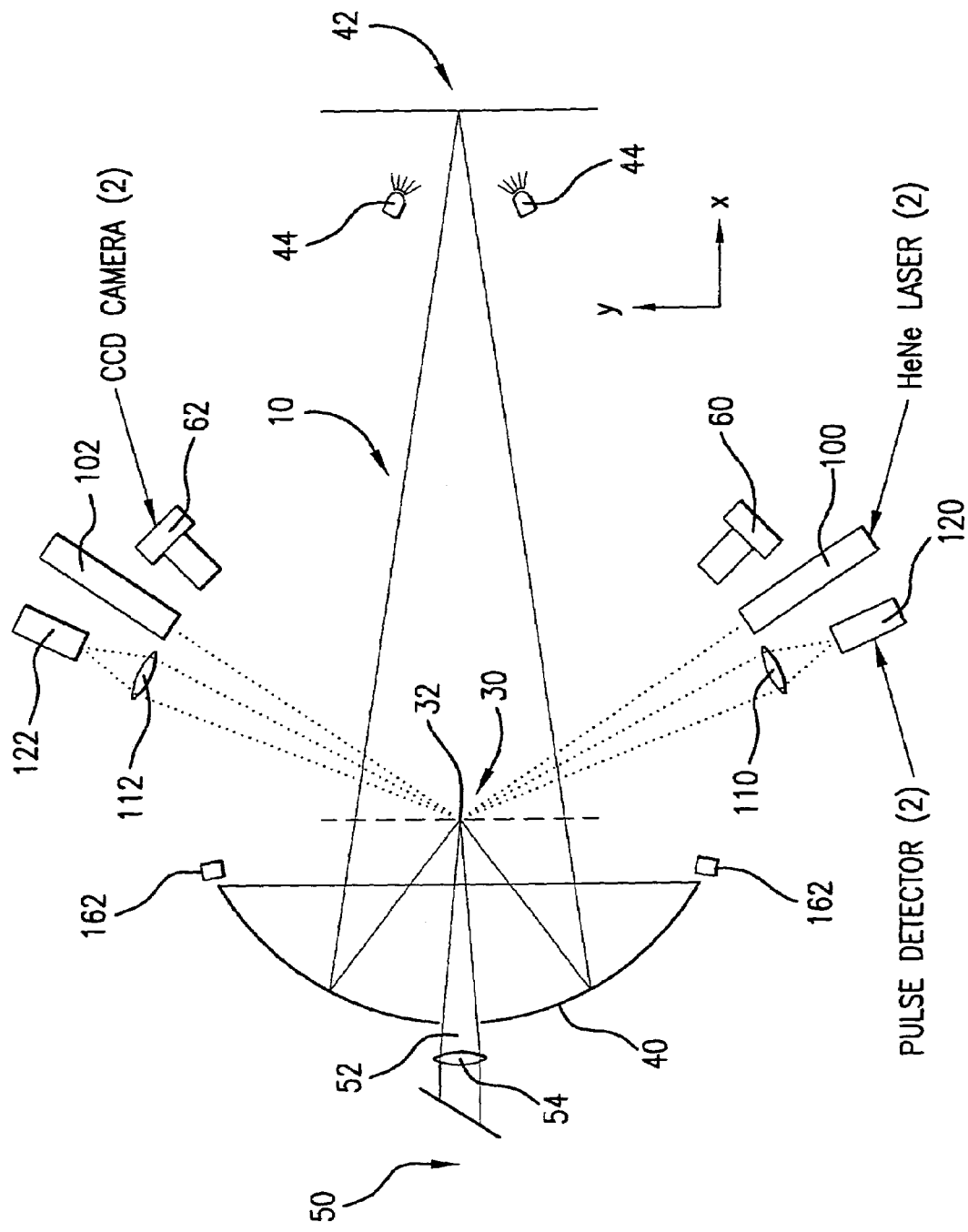
FIG. 1 shows aspects of an embodiment of the present invention illustrated schematically.
Figure 2:
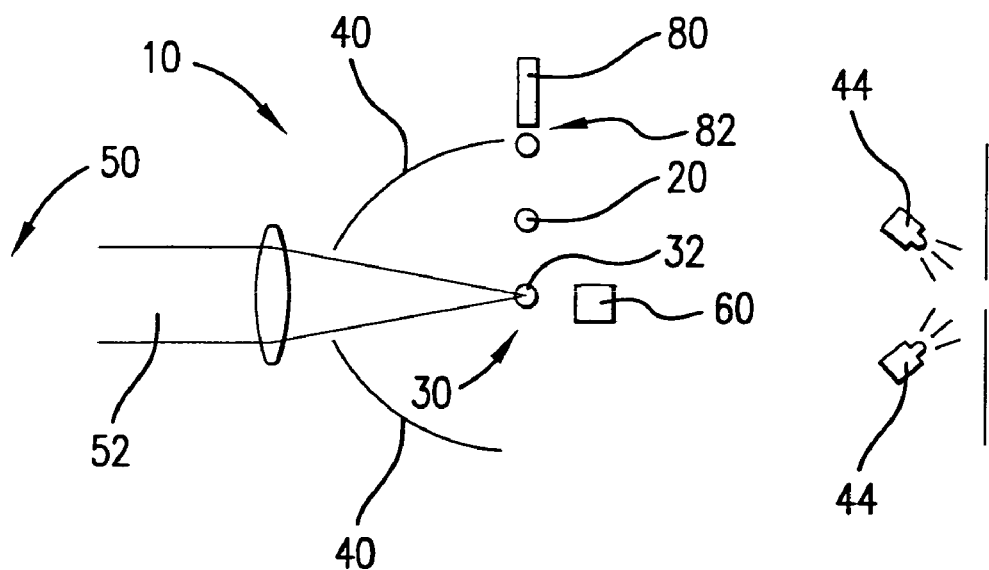
FIG. 2 shows a side view of aspects of the present invention illustrated schematically as in FIG. 1

According to aspects of an embodiment of the present invention, Applicants propose portions of an EUV light source system 10, illustrated schematically in FIG. 1, that is capable of aspects of active control of the position, pointing and focusing of an EUV plasma initiation drive laser(s) and pre-pulse laser(s) directed at a target, e.g., in a plasma formation/EUV source chamber 64 (not shown in FIG. 1), e.g., a moving droplet (20, as shown in FIG. 2) of liquid metal, e.g., lithium, which may be mass limited.

Some general requirements according to aspects of an embodiment of the present invention include the need to collect as much EUV light from the LPP as possible according to which applicants presently contemplate a need for about a 5 sr solid angle for collection of the plasma produced EUV light. In addition, contemplated is to provide a matching angle to the illuminator with a need for the correct solid angle for acceptance at the intermediate focus 42 ("IF"), e.g., about 0.038 sr. Presently contemplated is the use of an ellipsoid as the geometrical shape for the collector 40, which can be related to a working distance w from a plasma formation point, e.g., at a desired plasma initiation site, e.g., at the focus 32 of the collector 40, a collector 40 diameter D, or a selected distance between the LPP desired plasma initiation site and the IF, or some combination thereof. With, e.g., such an ellipsoidal design for a primary collector 40, a working distance may be, e.g., 200 mm, an outer diameter may be, e.g., driven by collection and acceptance angles and, for 5 sr collection angle/200 mm working distance this may imply the need for, e.g., a substrate OD of, e.g., 622 mm for such an exemplary 0.038 sr acceptance angle. Also currently contemplated is a single shell design, with a monolithic substrate making thermal and opto-mechanical design considerations easier, although for other than concept proof, more complex compositions and geometries may be required.

Turning now to FIGS. 1 and 2 there are shown aspects of an embodiment of the present invention. The applicants propose a system 10 in which laser produced plasma ("LPP") extreme ultraviolet ("EUV") light source targets, e.g., droplets 20 of liquid lithium, at the rate of 10-20 thousand per second, or even higher rates, and traveling at velocities of about 20 m/sec and of a size of about 10 µm in diameter, or possibly higher, e.g., up to around 40 µm, can be tracked to within accuracies of less than the diameter of the target 20 and calculated to be located at a selected initiation site 30 (e.g., as close on the track of the target droplet 20 to the actual desired initiation site, e.g., at the focus 32 of a collector mirror 40 at a specific time, in order to fire a drive laser 50 (not shown) to produce a drive laser beam 52 to intersect the target droplet 20 at the selected initiation site with about a 50-100 ns timing tolerance. It will be understood that the desired plasma initiation site corresponds to the focus 32 of the collector, but that some error, e.g., within a sphere of about a 10 µm radius about the focus of the collector ("the desired plasma initiation region") may still produce effective amounts of EUV light at the intermediate focus 42. As such the system 10 may be configured to aim the laser beam at a selected plasma initiation site which is not the desired plasma initiation site but within this acceptable positioning error region, the desired plasma initiation region, while the system is concurrently correcting the track of the targets and the positioning of the drive laser beam at selected plasma initiation sites to eventually be at the desired plasma initiation site 32, i.e., at the focus of the collector 40. It will be understood that if the target track is sufficiently in error in any axis to not allow for plasma initiation within the desired plasma initiation region, the system 10 may block the triggering of the laser until this condition is corrected by the system 10, or alternatively allow continued firing of the laser at selected plasma initiation sites outside the desired target initiation region while the target tracks and laser pointing are moved to place the selected plasma initiation site within the desired plasma initiation region and eventually at the desired plasma initiation site.

To accomplish these requirements applicants propose to provide imaging equipment, e.g., digital video or motion picture imaging equipment, e.g., two imaging devices 60, 62, which may be, e.g., digital cameras having a digital output representative of the video intensity of each pixel in the camera's field of view, e.g., between 0 and 256 shades of gray. The cameras 60, 62 may be CCD cameras. The cameras 60, 62 may have a frame rate as is typical for current video cameras, e.g., 30 frames per second, though other frame rates may be utilized as well according to aspects of embodiments of the present invention. The cameras 60, 62 may be focused, e.g., using a cylindrical lens (not shown) in two planes intersecting the target droplet 20 line of flight (e.g., target delivery stream 92 shown in FIG. 3) from a release point, e.g., at a target delivery system 80 outlet 82, as shown in FIG. 2, or the camera may be otherwise lensed. Each of the two cameras 60, 62 may be placed, e.g., to view along the track of the droplet 20 from the delivery system 80 to the selected initiation site 30 and including in the view the desired plasma initiation site 32 as well, and oriented, e.g., 90° from each other to detect the position of the respective target track 92 in, respectively, an x axis and a y axis, each generally orthogonal to the respective target track 92 from the target delivery system 80 to the desired plasma initiation region around the desired plasma initiation site 32.

This is illustrated in more detail in FIG. 3 where the field of view of the respective camera, e.g., camera 60, includes an image of the target stream 92 (above the desired plasma initiation site 32) and 92' below the desired plasma initiation site 32, each of which may be slightly different in intensity (e.g., shade of gray) due to the fact that the stream 92 has more droplets 20 in it before plasma formation by some of the droplets 20 than the stream 92' after plasma formation by some of the droplets 20.

It will be understood that the terms above and below and horizontal and vertical are used throughout this application only illustratively and coincide with those directions as illustrated in the drawings for illustrative purposes only. The directions and orientations may be different in actual operation, e.g., the droplets may be directed to the desired plasma initiation site 32 by imparting a velocity to the droplet 20 at the target supply 82 and shooting the targets 20 at the desired plasma initiation site 32 as opposed to utilizing a purely gravity feed, in which event the stream need not be "vertical." Also shown in the schematic illustration of FIG. 3 is the image 90 in the camera 60 field of view of the intermediate focus, illustrated as a circle or oval 90. It can be seen, as illustrated in FIG. 3 that the stream 92, 92' may be slightly off in the respective horizontal axis from passing through the desired plasma initiation site 32, the detection and quantification of which from the image data of the respective camera 60, 62 may be used to direct the target delivery system to redirect the target delivery stream 92 and may also be used to direct a drive laser to a selected plasma initiation site for a next to be irradiated droplet 20, according to the actual track of the flight of the droplets 20 and whether or not, e.g., that track passes through a desired plasma initiation region around the desired plasma initiation site 32 at the focus of the collector 40. It will be understood that the image in the second camera 62 may be similarly used for control of the stream track 92 in a second axis, e.g., the x axis, so that the selected initiation site 30 can be moved to the desired initiation site 32, which coincides with, e.g., a focus of an elliptical collector mirror 40, so as to thereby focus the reflections from the collector mirror 40 of the EUV produced by target irradiation at a selected plasma initiation site 30 to the IF at a second focus of the elliptical collector 40 mirror system, and move the selected plasma initiation site 30 to the desired plasma initiation site 32.

Figure 3:
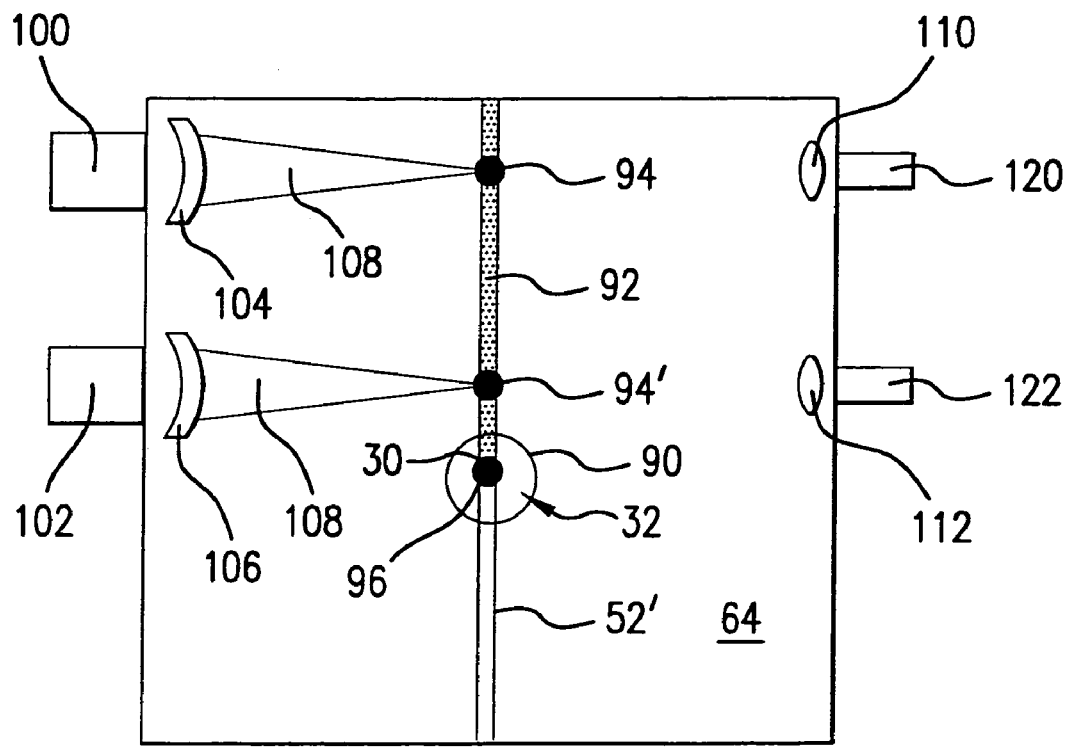
FIG. 3 shows further details of the schematic illustrations of aspects of an embodiment of the present invention illustrated in FIGS. 1 and 2.
Figure 4:
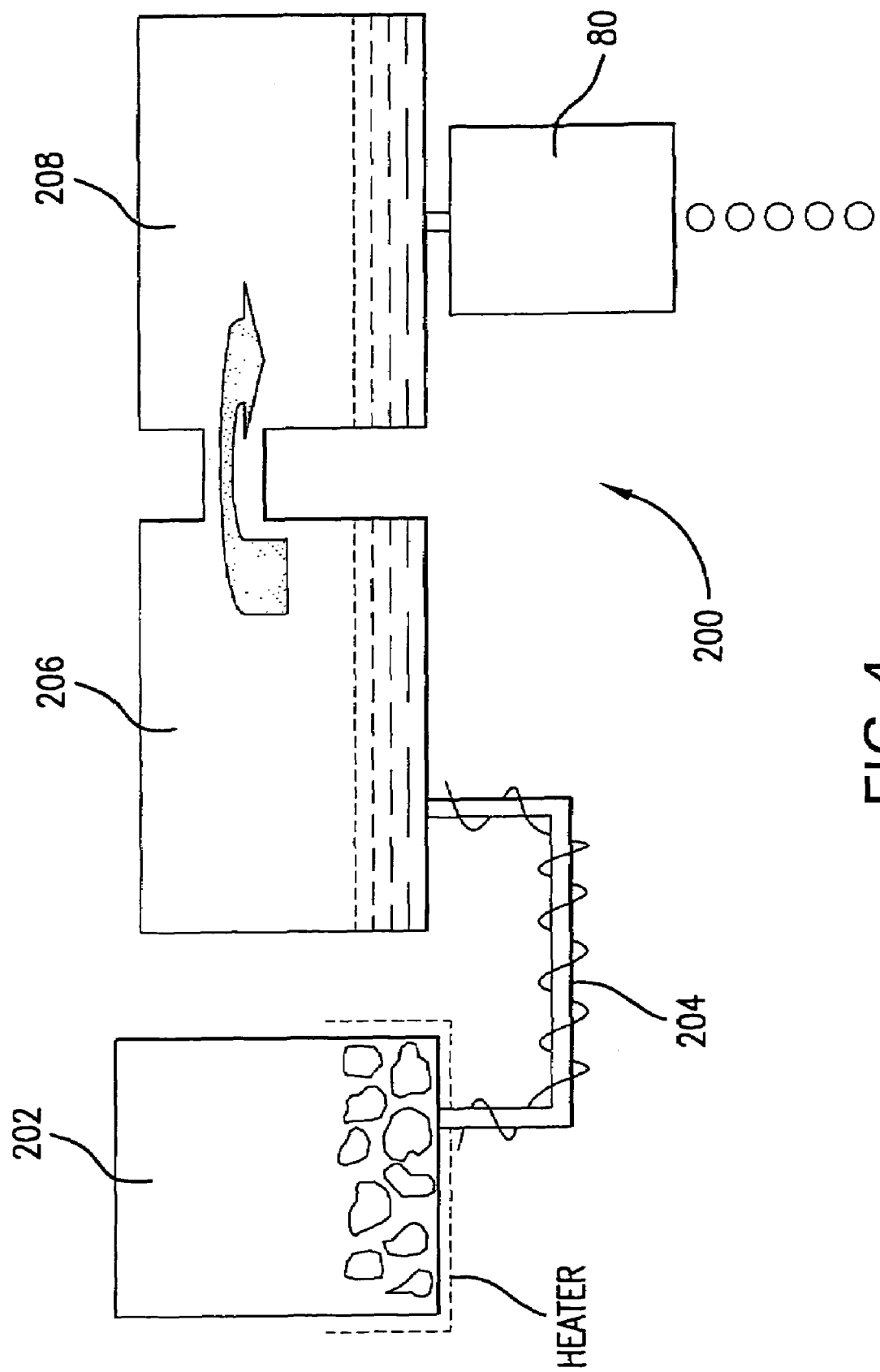
FIG. 4 shows schematically an in situ lithium purification system according to aspects of an embodiment of the present invention.

Also illustrated in FIG. 3 schematically is the utilization of a pair of continuous wave, e.g., HeNe lasers to illuminate droplets 20 as they pass by selected positions in the target track 92 intermediate the target delivery system 80 and the desired plasma initiation site 32. The laser beams 108 from the HeNe lasers may be tightly focused into a selected plane, e.g., by cylindrical lenses 104, 106 and the intersection of a droplet 20 with first the beam from laser 100 and then the beam from laser 102 may be detected by, e.g., photo-detectors 120, 122, respectively, through, e.g., focusing lenses 110, 112. In this way, the successive flashes indicative of the respective droplet intersecting point 94 and then point 94' may be detected as flashes of light by the detectors 120 and 122 respectively. It will be understood that lasers 100 and 102 may be, e.g., focused at a separation distance, e.g., equal to the droplet 20 separation or the detection circuitry suitably timed to discriminate between droplet crossings of different droplets 20. Also, it will be understood that, assuming a known or empirically determined droplet speed, only one laser, e.g., laser 100 and one detector 120 may be needed to determine the arrival timing of a respective droplet 20 at the selected plasma initiation site for purposes of timing the firing of the respective drive laser.

The other of the cameras 62 may have a field of view oriented in a plane perpendicular to the first camera 60. The two cameras 60, 62 can thus be used to triangulate in three dimensions the positions of moving target droplets 20. Each of the two cameras 60, 62 may have in its field of view an image 90 of the intermediate focus created by the collector mirror 40 represented by the oval 90 on CCD camera image. The center of this oval 90 can be considered to coincide with the desired plasma initiation site 32, i.e., where ideally plasma initiation should occur, i.e., at the focus 32 of the collector mirror 40. With the cameras 60, 62 working at, e.g., 30 frames per second, a relatively slow speed compared to the droplet velocity and the droplet repetition rate, e.g., 10,000-100,000 per second, the cameras 60, 62 will see those droplets 20 as a continuous stream 92 as illustrated in FIG. 3.

Alignment of these lasers 100, 102 on the stream 92 of droplets may be done using the two CCD cameras 60, 62, e.g., when the He—Ne laser light is focused right on the stream 92, the cameras 60, 62 will see a bright spot on the stream 92, which is centered on the stream 92. If the laser beam from the respective laser 100, 102 is slightly off, the bright spot 94, 94' will be off as well.

Two photo-detectors 120, 122 may each be used to look at light from respective laser 100, 102 reflected from the droplets 20 as they pass through the, e.g., tightly focused beam of these two He—Ne lasers 100, 102. Each of these detectors 120, 122 can then generates a pulse every time a droplet 20 passes through the timing spots 94, 94', respectively, of the corresponding He—Ne laser 100, 102. The detectors may also have filters and the lasers 100, 102 operated at different wavelengths, to facilitate the discrimination in the flashes from spots 94 and 94' respectively. The pulses generated by these photo-detectors 120, 122 may then be used, e.g., to calculate the speed and expected timing of the droplet 20 arrival at a selected plasma initiation site 30, which lies along the stream 92. A drive laser 50 can then be aimed at the selected plasma initiation site 30, e.g., along the stream 92, e.g., which is still within the desired plasma initiation region, and fired to intersect the droplet 20 at the selected plasma initiation site 30 at a calculated time of arrival of the droplet at the selected plasma initiation site 30.

A plasma created by the irradiation of the droplet target 20 at the selected initiation site 30 due to the absorption by the droplet 20 of the energy in the laser beam pulse 52 from the drive laser 50 will then also be visible as a bright plasma initiation image spot 96 on the CCD images of cameras 60, 62. Proper filters can be used to adjust the intensity of this plasma initiation image spot 96 on the CCD cameras 60, 62. This plasma initiation image spot 94 can be an indication of where the drive beam laser beam 52 was focused on the target droplet 20.

Horizontal alignment of the drive laser beam 52 may be done, e.g., by aiming the drive laser beam 52 plasma formation plane (which may be selected to be before the focus plane or after the focus plane of the laser beam 52 according to operating parameter requirements influenced by the selection of the plasma formation plane of the laser beam 52) and, e.g., in the horizontal plane of the selected plasma initiation site 30 in the desired plasma initiation region. The bright spot at the selected initiation site 30 may be centered in the middle of the stream 92 of droplets 20. For illustrative purposes, again recognizing that horizontal and vertical are for illustration only and coincide with the views of the drawings, the horizontal plane may be considered to contain the x and y axes of a coordinate system, generally orthogonal to a direction of target movement from the target droplet 20 supply toward the desired plasma initiation site 30, while the z axis is generally aligned with this direction of travel, and is in any event orthogonal to the horizontal plane. Because, according to aspects of an embodiment of the present invention, the drive laser(s) 52 may not be aimed at every droplet 20, there can also be a stream 92' of droplets 20 downstream of the selected target spot 30 as well. With this vertical alignment of the laser beam 52 done, e.g., by placing the bright spot 94 in the middle of the IF image oval/circle 90, i.e., at the horizontal axis, for any given x-y axes error(s) in the position of the selected initiation site 30 relative to the desired initiation site 32 at the focus of the collector mirror 40, will be the closest point that the droplet 20 will approach the desired initiation 32 site along path of the stream 92, and within the desired plasma initiation region around the desired plasma initiation site 32.

A feedback control loop may be used to walk the, e.g., two streams 92 seen respectively by the two cameras 60, 62 to center each at an imaginary centerline axis of the intermediate focus aperture, e.g., by horizontal translation of the target delivery system 80 in the horizontal plane x and y axes, to move the selected initiation site 30 to the desired initiation site 30. That is, to move the imaged streams 92 in the x-y plane to each intersect the desired plasma initiation site 32, and at the same time the system may be moving the laser aiming point to continue to intersect, e.g., the stream at a selected plasma initiation site along the image of the stream 92, to intersect a droplet at the selected plasma initiation site.

More precise timing adjustments of the drive laser 50 firing time may be done, e.g., to place the arrival of the pulse in the laser beam 52 from the drive laser 50 at the selected (and eventually desired) initiation site 32, 30 with the target droplet 20 fully within the beam for maximized irradiation of the target droplet 20, e.g., by a feedback loop that optimizes the EUV power produced in each plasma formation. A dithering technique can be used, e.g., dithering the trigger signal timing, to, e.g., converge on a maximum EUV plasma output. The EUV detectors measuring the balance of the EUV radiation at points surrounding the desired plasma initiation site 32, e.g., in one plane around the desired plasma initiation site 32, can also be used for input in adjusting the laser firing timing (trigger signal timing) to, e.g., the travel of a target droplet along the droplet stream path 92 toward the plasma initiation site 30, 32.

An alternative or supplemental technique for precise laser timing adjustment and horizontal alignment may use, e.g., four EUV detectors 154 placed outside of the collector 40. According to aspects of this embodiment of the present invention, e.g., when the laser beam is aligned horizontally and vertically to the selected/desired plasma initiation site, and properly timed, the signals from all four of the detectors 154 will be the same, indicating that the intersection of the entire target droplet with the laser beam 52 is occurring, and thus properly timed. The output of these detectors may be utilized as explained in more detail in regard to FIG. 3A in determine when to trigger the drive laser 50 or a respective one of the plurality of drive lasers 50 to optimize the irradiation of a target droplet 20.

Turning now to FIG. 3A there is illustrated in block diagram schematic form an exemplary metrology system 150 according to aspects of an embodiment of the present invention. The system 150 may comprise, e.g., the camera 60, 62 providing inputs in digital form to an image processing module 152, which may process the images from camera 60 independently from those of other camera, e.g., camera 62.

The image processing module 152 may provide an output indicative of HeNe flash intensities to a HeNe pointing control module 170, which may, e.g., translate horizontally the respective HeNe laser 102, 104 to maximize the intensity of the flashes detected in the camera image in feedback control, e.g., to properly point the HeNe lasers at the stream 92.

The image processing module 152 may also provide a position error signal for each camera image, e.g., between the actual plasma initiation site 32 and the center of the IF aperture image, e.g., in imaginary horizontal and/or vertical planes, to a source laser control module 172. The source laser control module may utilize this information from respectively camera 60 and camera 62 for source laser aiming control in, e.g., the y and z axes.

The image processing module 152 may also provide, e.g., a droplet stream error signal indicative of the error between the stream path 92 for a respective camera 60, 62, with respect to an imaginary vertical centerline axis of the IF aperture image in each of the x and y axes as indicated respectively from the image in camera 60 on the one hand and camera 62 on the other, i.e., through the desired plasma initiation site 32. This can then be used by the droplet control module 174 to generate x, y axis feedback control signals to the droplet delivery system 80.

The outputs of the photo-detectors 120, 122 may be utilized to provide input signals to a laser trigger control module 154. The laser trigger control module 154 may use the timing between the detected flashes from detector 120 and 122 respectively as an indication of the droplet 20 speed along the path 92 toward a selected initiation site 30, also along that path 92, and, as noted above within the desired plasma initiation region, so as to be, e.g., as close to the desired initiation site 32 as possible. This may be utilized then to produce a trigger signal to a source drive laser control module 180 to fire the source laser 50 to time the arrival of the source laser pulse 52 at the selected initiation site 30 along the path 92 at the same time the target droplet 20 arrives at the selected plasma initiation site 30 within the desired plasma initiation region around the desired plasma initiation site 32.

Aspects of EUV light source apparatus and methods include, among other things, optical design, opto-mechanical design, thermal engineering, substrate selection and fabrication, multi-layer reflective coating development and fabrication. As discussed in co-pending applications mentioned above, it is currently contemplated to operate a collector mirror inside of an EUV generation chamber 64 at a temperature of between about 400-500° C., with the objective of, e.g., evaporating lithium in a liquid-lithium target system to, e.g., preserve the reflectivity characteristics of the mirror multi-layer reflectivity stack forming near normal angle of incidence EUV reflective mirrors of the collector 40 for collection of the generated EUV radiation, e.g., from a plasma generated using a drive laser(s). It will be understood that near normal angle of incidence includes angles of from 0° and about 45°, between the incident EUV radiation and the normal to the mirror surface, for which, e.g., multilayer reflective coatings formed by stacks of many tens of layers to one hundred or so layers allow for reflection of light at EUV wavelengths, e.g., at 13.5 nm, while reflecting surfaces of uncoated material or having a reflective coating of only, e.g., two layers, may be used to reflect light at EUV wavelengths, but only at so-called grazing angles of incidence, which those skilled in the art will understand to be up to about 70°-90° from the normal, depending on wavelength, reflective material, coatings and the like.

A number of contemplated designs exist for a collector mirror 40, e.g., including a simple ellipsoidal mirror having, e.g., a focus desired plasma initiation site 32 at one focal point of the ellipse and the intermediate focus 42 of the collector mirror 40 at the other focus of the ellipse, comprising an entry point from the EUV light generator 10 into a utilization tool, e.g., an EUV integrated circuit lithography tool. This design may result in the inability to collect a substantial fraction of the photons emitted from the plasma, depending upon a number of factors, including the direction that the plasma actually emits photons, given the drive laser irradiation geometries and techniques actually employed, among other factors. Another possibility is a spherical primary collector mirror or an ellipsoidal primary collection mirror with grazing incidence secondary focusing mirrors.

Regardless of the selection for the collector optics, some provision will need to be made for protecting the optics from debris generated within the EUV plasma formation vessel/chamber 64 as has also been discussed in co-pending applications referenced above.

Applicants address in the present application aspects of an embodiment of the present invention, which for convenience of illustration will be explained in reference to an illustrative assumed collector geometry, i.e., that of the spherical primary collector mirror 40, e.g., with a solid angle to the IF of between 0.03-0.20 sr, a maximum collector mirror 40 outer diameter ("OD") of 45 cm, a minimum collector 40 OD of 25 cm, and a collection angle of from $5\pi$-$2\pi$ sr. Regardless of collector 40 geometry ultimately selected, the collector optics (mirror 40 and the other possible elements) must maintain shape at operating temperature. Also for purposes of illustration this is selected to be in a range of 400-500° C., or even higher, e.g., up to about 700° C. The selection of a spherical geometry simplifies somewhat the illustrative calculations referred to in the present application, but the principles enunciated in this application are applicable as well to ellipsoidal or other, e.g., hyperbolic and other conic geometries. Table 1 includes other illustrative factors and assumptions relating to designing, e.g., an illystrative thermal management system for an EUV light source chamber collector 40.

TABLE 1

Calculate Heat Load on Ø45 cm Mirror:

| | |
|---|---:|
| In Band 13.5 nm EUV Power at IF (W) | 115.00 |
| Transmission of Buffer Gas | 0.90 |
| In Band 13.5 nm EUV Power from Mirror (W) | 127.78 |
| Mean Reflectivity of Mirror | 0.50 |
| EUV Power Onto Mirror (W) | 255.56 |
| Mirror Collection Angle (sr) | 5.00 |
| EUV Power into $2\pi$ (W) | 321.14 |
| Conversion Efficiency (into $2\pi$, in band) | 0.03 |
| Plasma Power into $4\pi$ (W) | 10,704.69 |
| Plasma Power onto 5 sr Mirror (W) | 4,259.26 |
| Spherical Radius of 5 sr Mirror with OD = 45 cm (cm) | 22.99 |
| Surface Area of 5 sr Mirror with OD = 45 cm (cm$^2$) | 2,642.70 |
| Heat Load on 5 sr Mirror (W/cm$^2$) | 1.61 |
| Mirror shell has two surfaces | 0.81 |
| Stefan-Boltzmann: | |
| Ideal Black Body Radiation at 400° C. (W/cm2) | 1.16 |
| Ideal Black Body Radiation at 500° C. (W/cm$^2$) | 2.02 |
| Mean Emissivity Required @ 400° C. | 0.69 |
| Mean Emissivity Required @ 500° C. | 0.40 |

TABLE 2

| Property | Material | | | | | | | | | |
|---|---|---|---|---|---|---|---|---|---|---|
| | Beryllium | Single Crystal Silicon | Sintered Silicon Carbide | Reaction Bonded Silicon Carbide | CVD Silicon Carbide | Molybdenum | Zerodur (Schott) | ULE (Corning) | Aluminum 6061-T6 | Nickel |
| Thermal Conductivity, k (W/m · K) | 210.0 | 124.0 | 110.0 | 150.0 | 250.0 | 138.0 | 1.5 | 1.3 | 180.0 | 82.9 |
| Thermal Expansion Coefficient, α (ppm/K) @ 20° C. | 11.6 | 2.5 | 4.4 | 1.9 | 3.5 | 5.1 | 1.0E−07 | 1.0E−05 | 23.6 | 13.3 |
| Specific Heat @ 20° C. (J/kg · K) | 1886 | 702 | — | — | 640 | 276 | 821 | 776 | 896 | 471 |
| Yield Stress (MPa) | 380 | 120 | 552 | 307 | 450 | 550 | | 49.8 | 276 | 59 |
| Elastic Modulus (GPa) | 303 | 112.4 | 400 | 393 | 466 | 320 | 90.3 | 67.6 | 68.9 | 207 |
| Max Service Temperature (° C.) | — | — | 1650 | 1400 | >1400 | — | <500 | <500 | — | — |
| Melting Point (° C.) | 1283 | 1412 | | | 2610 | | N/A | | 652 | 1453 |
| Density (g/cm$^3$) | 1.848 | 2.329 | 3.1 | 3.1 | 3.2 | 10 | 2.53 | 2.21 | 2.7 | 8.9 |
| Li Compatibility | Risk | Poor | Risk | Risk | Risk | Good | Poor | Poor | Poor | Risk |

Selection of materials for the collector 40 body 220 involves consideration of ultra high vacuum ("UHV") compatibility, serviceability at a temperature >500° C., good thermal stability, high thermal conductivity, low coefficient of thermal expansion, high strength, good dimensional stability, particularly at elevated operating temperature, and for, e.g., normal or grazing incidence angle reflection the capability of being polished to an extremely high quality figure and finish. Such may include obtaining high quality figures and finish, e.g., approximately 4 Å, e.g., using high spatial frequency rougheners ("HSFR"). Also important can be the ability to bond to other materials. Table 2 refers to some materials and illustrative properties.

With regard to multi-layer reflective coating stacks for normal angle of incidence reflection the following considerations need to be taken into account, i.e., high temperature stability needed for LPP with Li, interlayer diffusion of multi-layers, reflectivity degradation at elevated temperature, impact of exposure to Li and Li compounds, sputtering from high energy Li particle impact or other materials e.g., high energy ions and other debris, implanting and diffusion of Li into multi-layers, selection of capping layer as a barrier, other contaminants on the mirror surface and sputtering of other materials from other components inside chamber.

It will be understood by those skilled in the art that according to aspects of an embodiment of the present invention the present invention includes, e.g., an optical design may comprise an ellipsoidal primary collector 40, which may have, e.g., a working distance of 200 mm from an EUV plasma initiation site 32 to the collector 40 reflective surface comprised of a reflective multi-layer reflective coating. The size of the outer diameter of the collector 40 may be driven, e.g., by collection and acceptance angles, e.g., for a 5 sr collection angle/200 mm working distance, a substrate outer diameter of about 622 mm could be needed for, e.g., a 0.038 sr acceptance angle.

Considering a single shell design, without the inclusion of efficiency improvements and tradeoffs which could become more complex, and designs, including, e.g., auxiliary collectors could also add to the complexity, according to aspects of an embodiment of the present invention the present invention may be considered to utilize, e.g., a monolithic substrate.

This can enable, for evaluation purposes, easier thermal and opto-mechanical designs, e.g., utilizing the above referenced materials in Table 2, e.g., with SiC or Ni or other materials, e.g., Mo, Be and Si.

Figure 5:
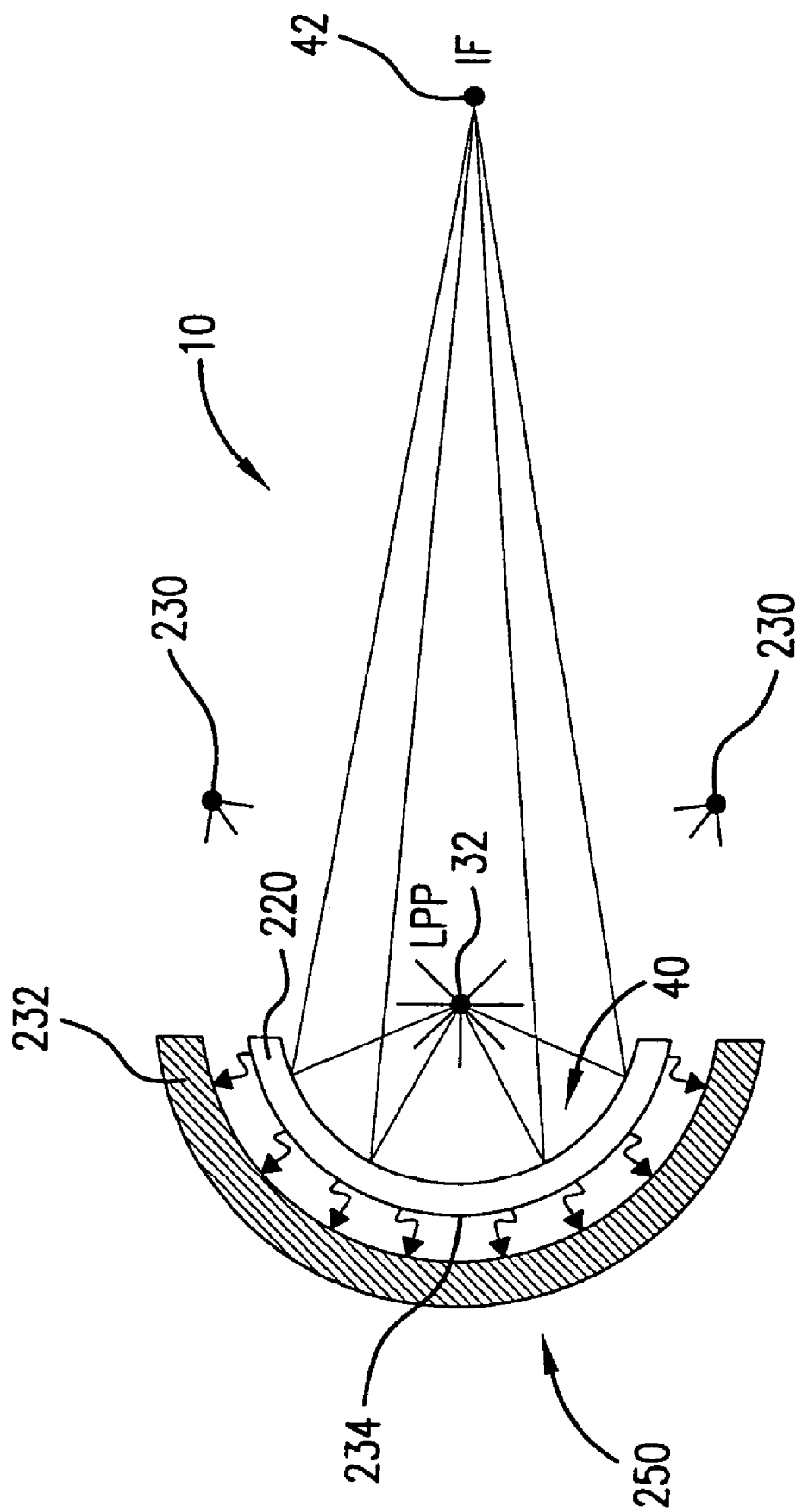
FIG. 5 shows aspect of an embodiment of a collector according to an embodiment of the present invention.

According to aspects of embodiments of the present invention an optical shell 220 capable of collecting and redirecting the EUV light to a second, or "intermediate" focus 42 is provided, as shown in FIG. 5. The shell 220 may be made, e.g., of a suitable material, which may be constructed to have a significant thermal mass. Thermal mass is a function of both heat capacity and thermal conductivity of a structure of a given material. Heat capacity is a measure of how much heat different types of material can hold. For a given structural element of a given material, it is found by multiplying the density of the material by its overall thickness, and then by its specific heat. Specific heat is the amount of heat a material can hold per unit of mass. For example, for large heavyweight materials, it can take a significant amount of energy to heat up their surface. This is because much of the energy is actually absorbed deeper into the material, being distributed over a larger volume. With a lot of energy incident on the surface, this absorption can continue until it travels through its entire width, emerging on the inside surface as an increase in temperature. This conduction process can take a significant amount of time. If the energy incident on the surface of one side fluctuates, this can set up "waves" of temperature flowing through the material.

Suitable materials may include but are not limited to silicon carbide, silicon, Zerodur or ULE glass, aluminum, beryllium, molybdenum, copper and nickel.

The collector shell 220 may be exposed to heat flux from the laser produced plasma, which results in radiative heat loads such as those referenced above in Table 1. Such thermal loads, combined with the thermal mass of the shell 220, then result in a steady state temperature of the shell 220, which may, e.g., be less than the operating temperature required for evaporating the source element (Li) debris from the reflective surfaces of the collector 40. This is so since the emissivity of the radiating surfaces of the optic 40 combined with its temperature can result in the ability to radiate more thermal energy than is deposited by the laser produced plasma.

Additional heat flux to maintain the required operating temperature of the optic 40 may then have to be provided, e.g., by auxiliary radiant heaters 230. These radiant heaters 230 may be placed in suitable locations in front of or even behind the body 220 of the collector 40 and may need to have a directional capability, e.g., using a directional control mechanism (not shown) to accommodate the need for directing more or less radiation on the collector 40 or on certain areas of the collector 40 surface. Applicants now believe that approximately 5 kW of power or less may be needed to maintain a steady state temperature of about 500° C. on the collector body 220. Also presently contemplated is the ability to maintain temperature uniformity within 2° C. or better.

To maintain control of the desired operating temperature of the collector 40 a cooling system 250, which may include a cooling device 232, may also be needed. This cooling device 232 may, e.g., be utilized to absorb radiated heat from the rear side 234 of the collector body 220 of the collector 40. It is possible that this cooling device 232 can be a simple open loop cold surface behind the rear surface 234 of the collector body 220 of the collector 40 and may be gas or liquid cooled, e.g., with helium or water and maintained at some nominal temperature. If the power levels are low enough it is contemplated presently that it will be possible that the cooling may be entirely radiative without the need for, e.g., liquid or gaseous coolant, e.g. from a heat exchanger (not shown) for the cooling device 232. The emissivity of the rear surface 234 of the collector body 220 of the collector 40 may, e.g., then be arranged by design to be as high (close to unity) or as low as required. The design choices made for collector 40 geometry can, e.g., have a significant impact on the details of this cooling system 250. The basic concept, however, can accommodate many variations of design assuming the body 220 of the collector 40 is large enough to reradiate incident heat loads with a practically achievable value of emissivity on key surfaces.

It is also understood by applicants that the plasma emission at and from the LPP plasma formation is non-uniform. Applicants currently believe that the emission is in the form of a cosine or like distribution rather than an isotropic distribution. Applicants also currently understand that the thermal radiative energy distribution is also non-isotropic and probably also of the shape of the light emission, e.g., cosine as just noted. Such a non-isotropic distribution can, e.g., differentially heat the collector 40 and, e.g., more specifically the collector body 220 and collector 40 reflective optical surfaces, which can result in temperature related deformations or figure errors on, e.g., the collector 40 optics. Significant variations in temperature across the reflecting optics surfaces can lead to focus errors in the projection of the collector 40 optics, and/or, e.g., in the light-utilizing tool. Applicants propose to resolve this problem by correcting and managing variations in temperature across the reflector optics by differentially heating the collector 40, e.g., with zoned heaters. Such heaters may, e.g., be powered and controlled differentially to radiate differing amounts of heat to discrete areas of the collector reflective optic. Thus, if thermally induced deformations produce differentially distributed figure errors on the collector 40 optic surface these can be corrected by differentially heating the collector 40 with a suitable heater array.

An exemplary heater array and collector cooling system 250 is shown illustratively and schematically according to aspects of an embodiment of the present invention in FIG. 5A. The embodiment according to FIG. 5A shows heater elements 240 illustrated schematically to be, e.g., cross sections of heater element wires positioned, e.g., in some geometrically defined surface 242 intermediate the collector body 220 and the cooling element 232, serving to heat the collector body 220 as needed and also differentially, e.g., zonally as explained in more detail below with respect to FIGS. 5B and 5C.

Figure 5C:
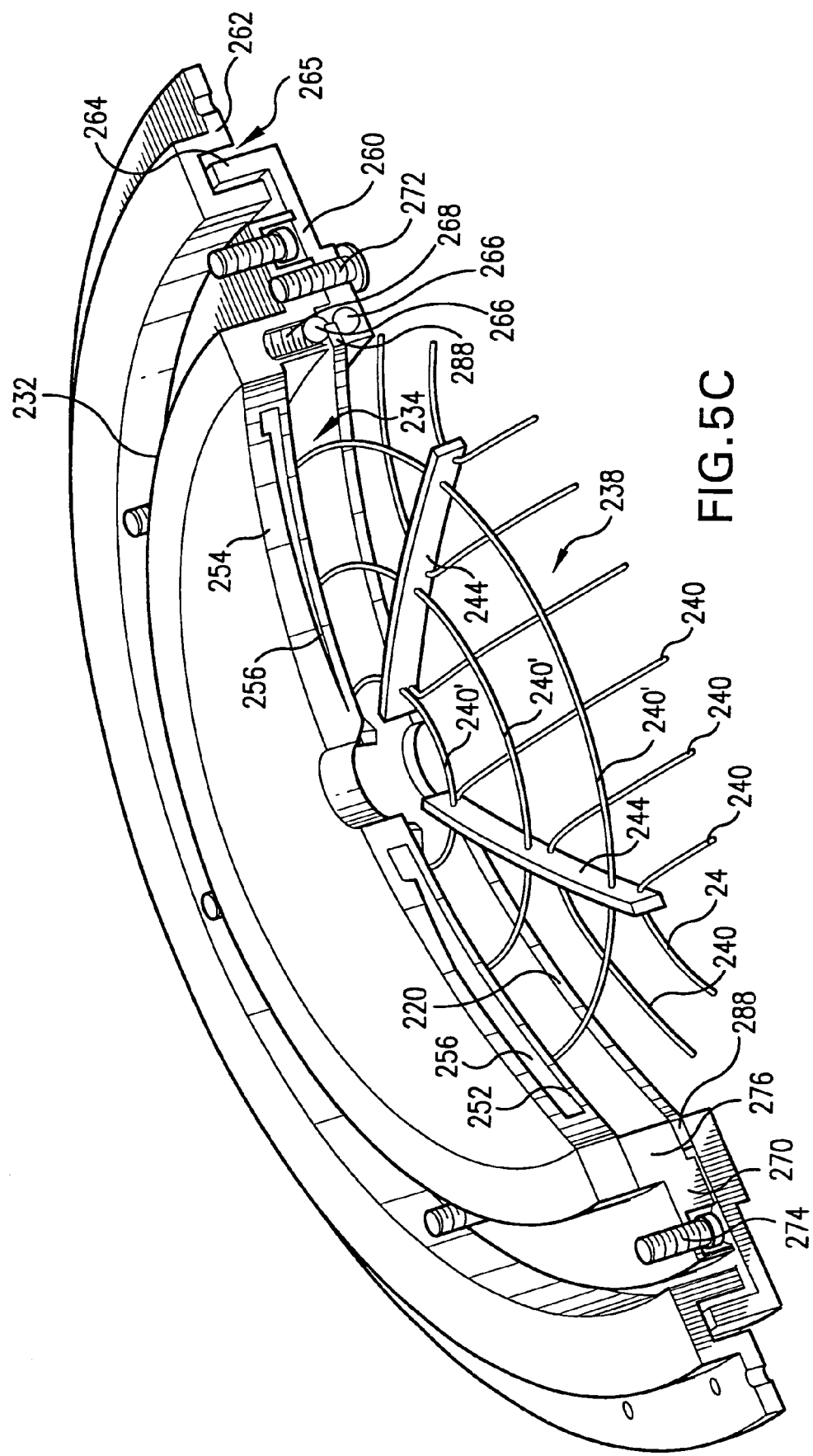

Turning to FIGS. 5B and 5C there is shown, respectively, a perspective view and a perspective cross-sectional view, of a cooling element/internal heat exchanger 232 that may be constructed, e.g., from a copper substrate formed of, e.g., C110 copper, and formed, e.g., from a first thin plate 252 and a second thicker plate 254 which may be brazed together at a joint (not shown) with the second thicker plate 254 having machined into it radial cooling galleries 256, which may be interconnected for fluid passage between the respective galleries, but need not be. The brazed joint (not shown) can be stronger than the copper itself. Also possible are other forms of joinder, e.g., diffusion bonding. The combination plate assembly 232 may then be shaped, e.g., by punching or dye pressing to form the appropriate shape to conform to the general shape of the back side of the collector body 220.

C110 is almost pure copper with a thermal conductivity of 388 W/mK and a 10 ksi yield stress making it relatively ductile and relatively easily formed into the shape to match the rear side of the collector body 220. In the assembly, e.g., all vacuum wetted joints may be, e.g., high integrity brazed joints. As shown in FIG. 5 B, the so formed cooling element 232 may form a structure for mounting heater elements 240, 240' on radially extending ceramic spacers 244.

Referring now to FIG. 5C there is shown in cross-sectional perspective isotropic view a collector and temperature control assembly 222 according to aspects of an embodiment of the present invention. The temperature control assembly 222 may include, e.g., the collector body 220 and cooling element 232 along with the heater assembly 238. The assembly 222 may include a sealing bracket 262, which, as illustrated, may be circular and may be attached to the side walls of the LPP chamber 64 by a side wall mounting ring (not shown). The sealing bracket 262 may have formed in it a circular sealing slot 265 to receive a sealing flange 264 on a sealing ring 260 which may serve together to form a seal, e.g., a labyrinth seal to prevent, e.g., lithium or other plasma source medium material, or other debris from reaching the copper of the cooling element 232.

The sealing ring 260 may be attached to a mounting ring 270 by attachment nuts 272. The attachment ring 270 may be attached to a mounting flange (not shown) e.g., formed at the terminus of at least one drive laser beam inlet passage 282 (not shown in FIG. 5C) by mounting ring nuts 274. A sealing ring (not shown) adjacent the mounting flange (not shown) at the terminus of the drive laser beam inlet passage 282 (not shown in FIG. 5C) may serve to hold an annular ring 236 on the cooling element 232 in place between an annular shelf 276 on the mounting ring 270 and the mounting flange (not shown).

The heater assembly may be formed of heater elements 240 forming a spaced apart quadrant grouping and/or heater elements 240' forming circular elements. Each of the elements 240, 240' may be separately activated with current through wiring (not shown) and controlled by a controller (not shown) to effect the desired differential heating, e.g., zonal heating. The ceramic spacers 244 may keep the heater elements 240, 240' in the space between the collector body 220 and the cooling element 232 and out of contact with either.

The collector body 220 may be formed to have an annular outer holding ring 288 held in place by a plurality of holding assemblies spaced around the circumference of the collector body 220 and formed of a pair of compression balls 266, one of which, e.g., in the mounting ring 270, may be spring biased with a spring 268 to firmly hold the collector body 220 in place, e.g., between the sealing ring 260 and the mounting ring 270, but not overly stressing the relatively brittle, e.g., glass, material of the collector body 220. It will be understood that the collector 40 optic, e.g., a multilayer stack forming a reflecting optic may be formed on or mounted on the collector body 220 spaced internally of the annular holding ring 288.

Some of the advantages of the design shown illustratively in FIGS. 5B and 5C are that heating the high emissivity back surface of the collector 40 body 220 may be more efficient than the heating contemplated in the design illustrated in FIG. 5. In addition, the reflectivity of the collector 40 optics, if any, to infrared radiation, is not an issue with the assembly as proposed in FIGS. 5A-5C. Further, the sealing of the cooling element 232 from the LPP plasma formation chamber 64 removes the issue of protecting the heater elements 240, 240' and/or the cooling element 232 from, e.g., the plasma source medium metal, e.g., lithium. The differentially controllable heater elements and their positioning concentrically and/or radially and/or in quadrature arrangements and selectively energizing the elements, may serve to better control the uniformity of the heating of the collector body 220 as required, as well as differentially compensating, if necessary, for differentially heating of the collector body 220 from the plasma production side of the collector 40. Furthermore, the heater elements 240, 240' do not compete for space in the EUV collection path nor interfere with placement of, e.g., target droplet distribution and/or tracking, or plasma formation tracking or like equipment and subsystems. The entire assembly 222 can also serve to shield opto-mechanical components from high temperature in the plasma formation chamber.

Applicants currently contemplate that some form of SiC as shown in Table 2 may have the best mix of properties for the collector body 220 substrate since there would exist, e.g., a low risk for coefficient of thermal expansion ("CTE") mismatch with reflective multilayer coatings. SiC is, however, a hard material and, therefore, time consuming to polish, though it may be Si clad and diamond turned and then polished. Due, e.g., to construction considerations, however, other materials such as Ni, e.g., Ni plating on other lighter materials, Mo., Be or plain Si may be useful. CTE issues may, however, be dominant with some or all of such other materials.

Figure 7:
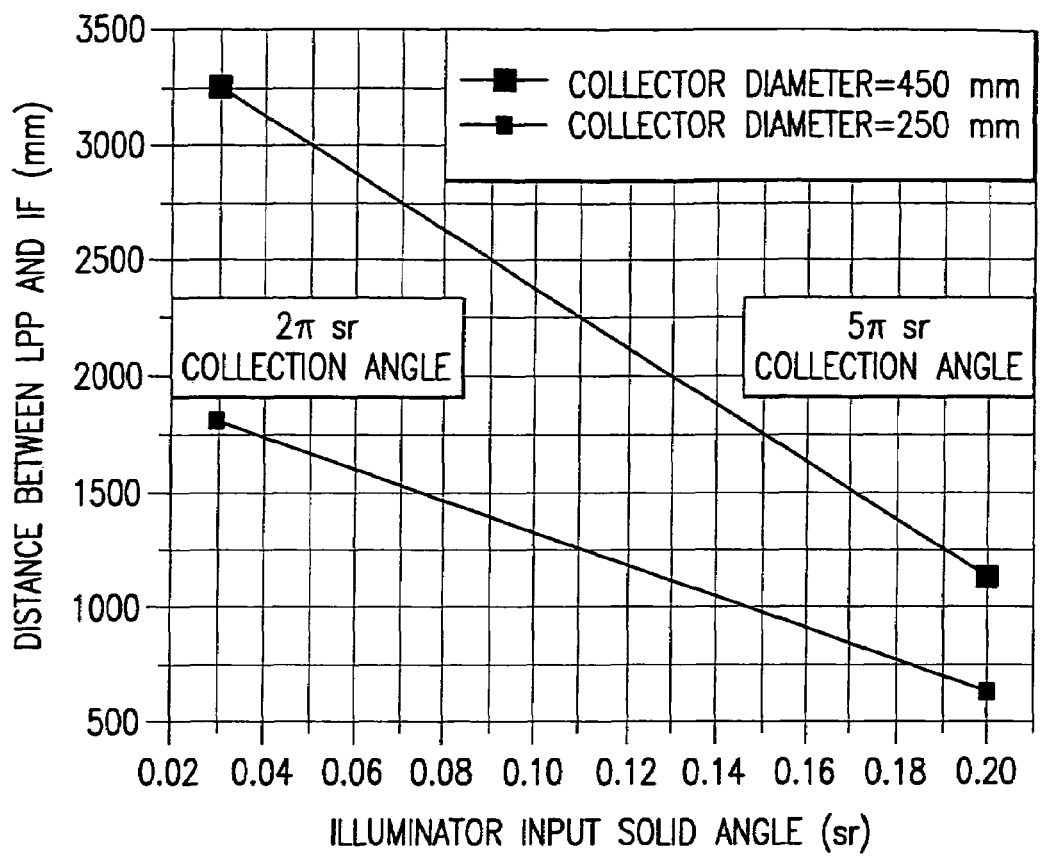
FIG. 7 is an illustration of the relationship between the distance between the laser produced plasma and the intermediate focus according to aspects of the present invention as a function of illuminator input solid angle, for collector diameters of 450 mm (5π sr collection angle) and 250 mm (2π sr collection angle)
Figure 8:
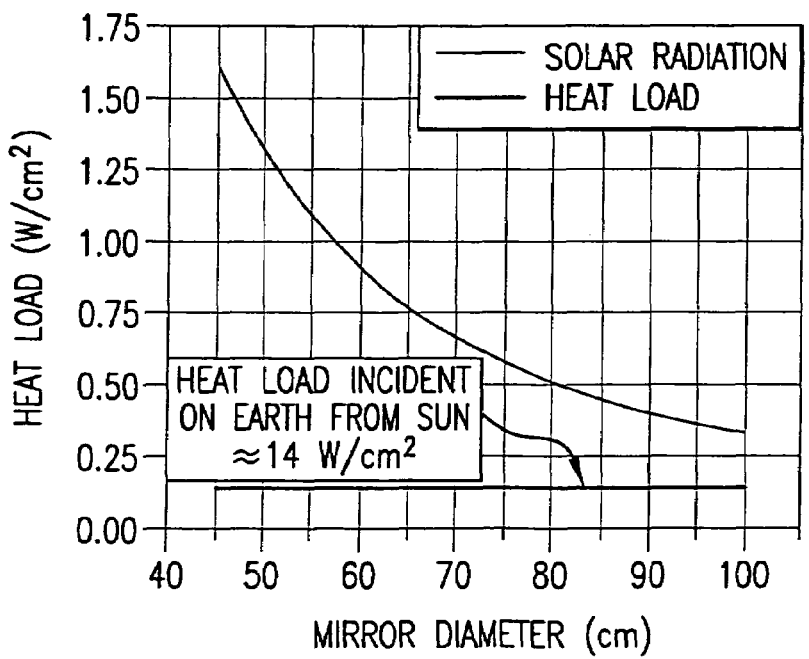
FIG. 8 is an illustration of the relationship between the heat load in W/cm$^2$ and the collector mirror diameter for a 5π sr collector and a comparison to the approximate heat load from solar radiation incident on the earth, i.e., ≈14 W/cm$^2$.
Figure 9:
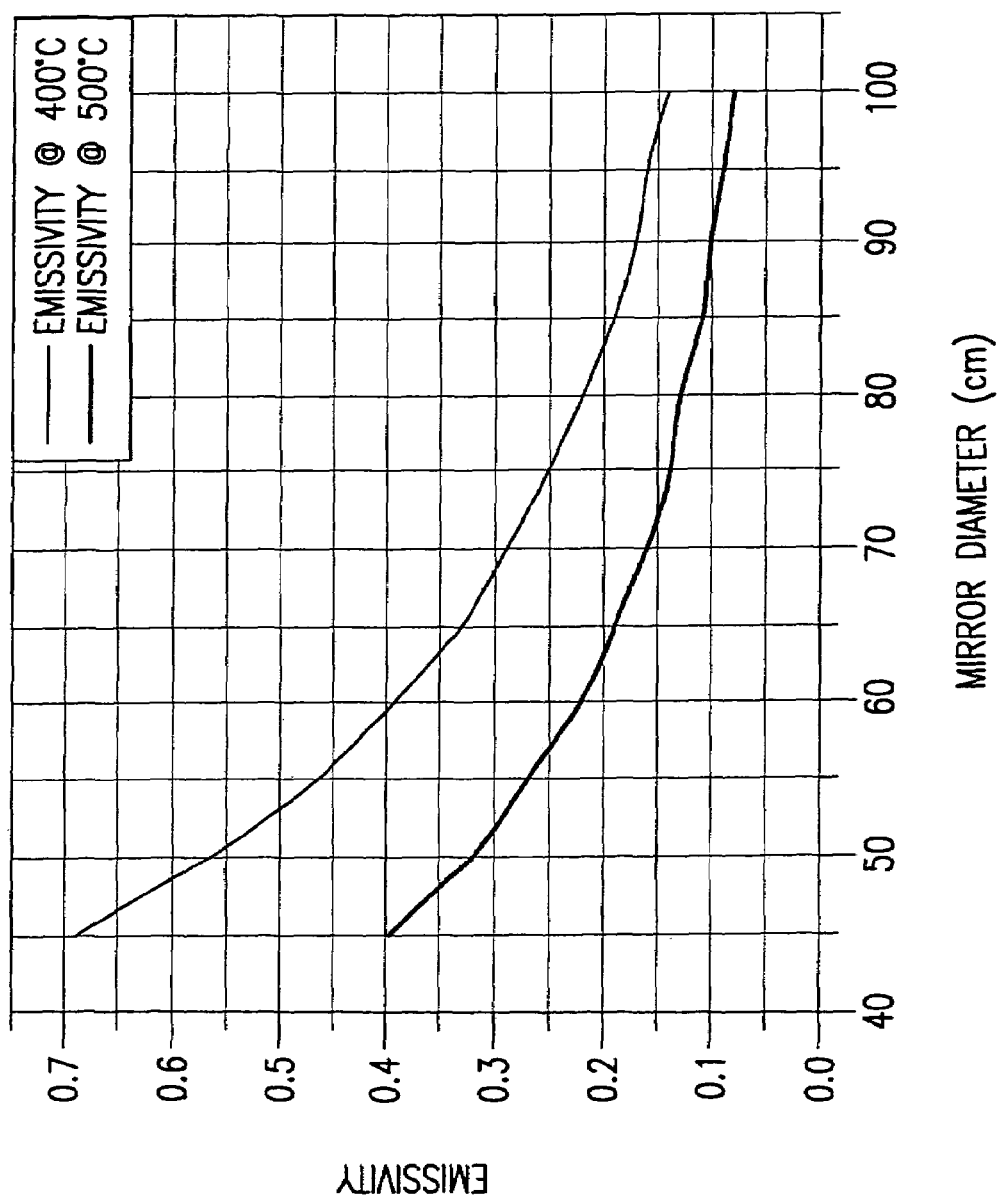
FIG. 9 is an illustration of emissivity as a function of mirror diameter at 400° C. and 500° C.

FIGS. 7-9 show graphs relating to the design of a heat management system for the LPP EUV light source collector 40 according to aspects of an embodiment of the present invention.

Figure 6A:
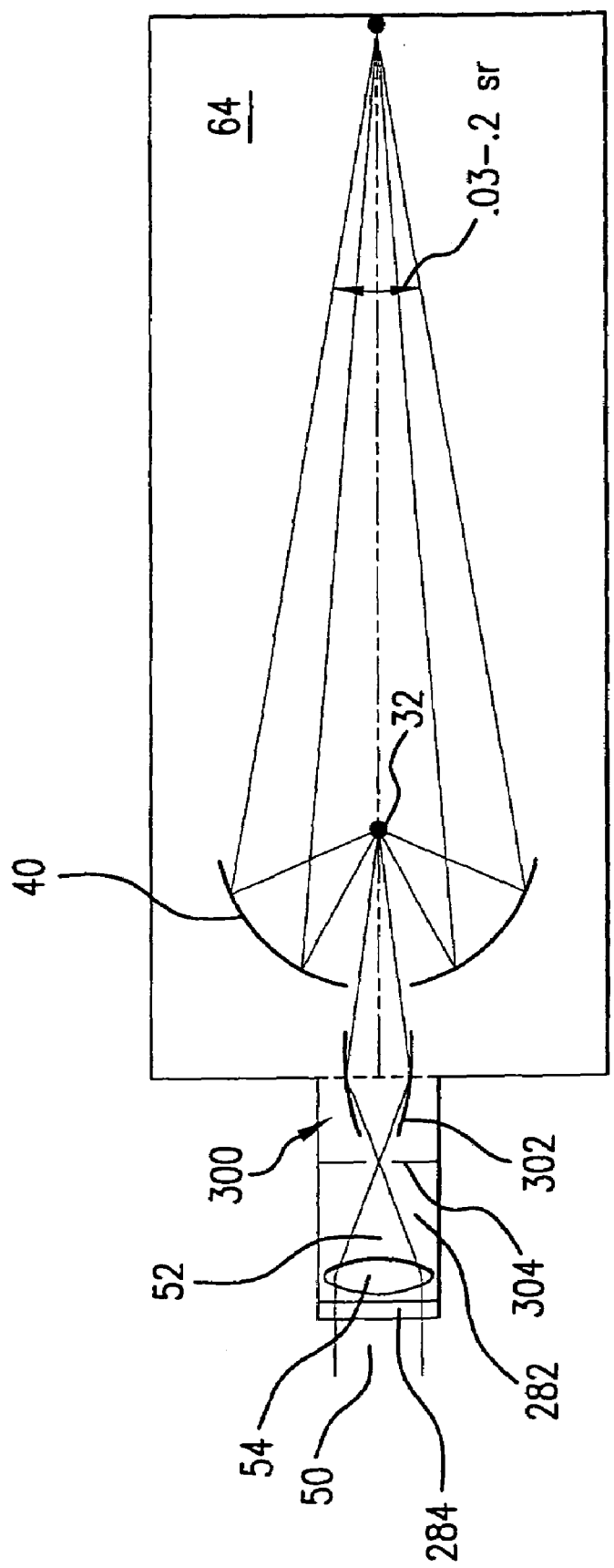

According to aspects of an embodiment of the present invention as illustrated in FIG. 6A an LPP drive laser beam 52 used as a radiation source for the target illumination for an LPP EUV source could be used in a vacuum chamber 64. This chamber 64 may, e.g., have a window 284 for the beam 52 and this window 284 may be, e.g., placed far from the laser target interaction zone including a desired initiation site 32. Focusing optics 300, e.g., a grazing incidence optic 302, made for example of refractive metal like Ru or others, may serve to focus the beam 52 on the interaction zone desired plasma initiation region around the desired plasma initiation site 32 (i.e., including selected plasma initiation sites 30 [not shown in FIG. 6A] if different from the desired site 32, but within the desired plasma initiation region, as discussed above). The focusing optic 300 may focus the beam 52, after the beam 52 has, e.g., been passed through a focusing lens 54 with a focal point between the lens 54 and the focusing optic 302, such that the rays in the beam 52 are incident upon points along the surface, e.g., an elliptical surface 302, of the focusing optic 300, including, e.g., nested such surfaces as shown in the art. The light reaching the grazing optic 300 surfaces 302 may thus appear to have come from a source at the focus of the focusing lens 54 intermediate the focusing lens 54 and the grazing incidence optic 300. The grazing incidence optic 300 may also be replaced by normal incidence reflecting optics as well. The optical element 302 may be elliptical, hyperboloid, ovate, parabolic, spherical or the like or combinations thereof, and functions to better focus the beam 52 at the plasma initiation site 32, 30 in the interaction zone inside the chamber 64. A small aperture, e.g., in a separation wall 304, which can be about 1 mm in diameter, may be used, e.g., to block target debris material and other debris material from reaching the focusing lens 54.

According to aspects of an embodiment of the present invention, therefore, aspects of EUV collection optics have been adapted for focusing laser radiation on the selected plasma initiation site 30, e.g., within the desired plasma initiation region around the desired plasma initiation site. All the protection schemes like heating and evaporation, etc., and others including those discussed below, then can be used for this optic 300 also.

Figure 6D:
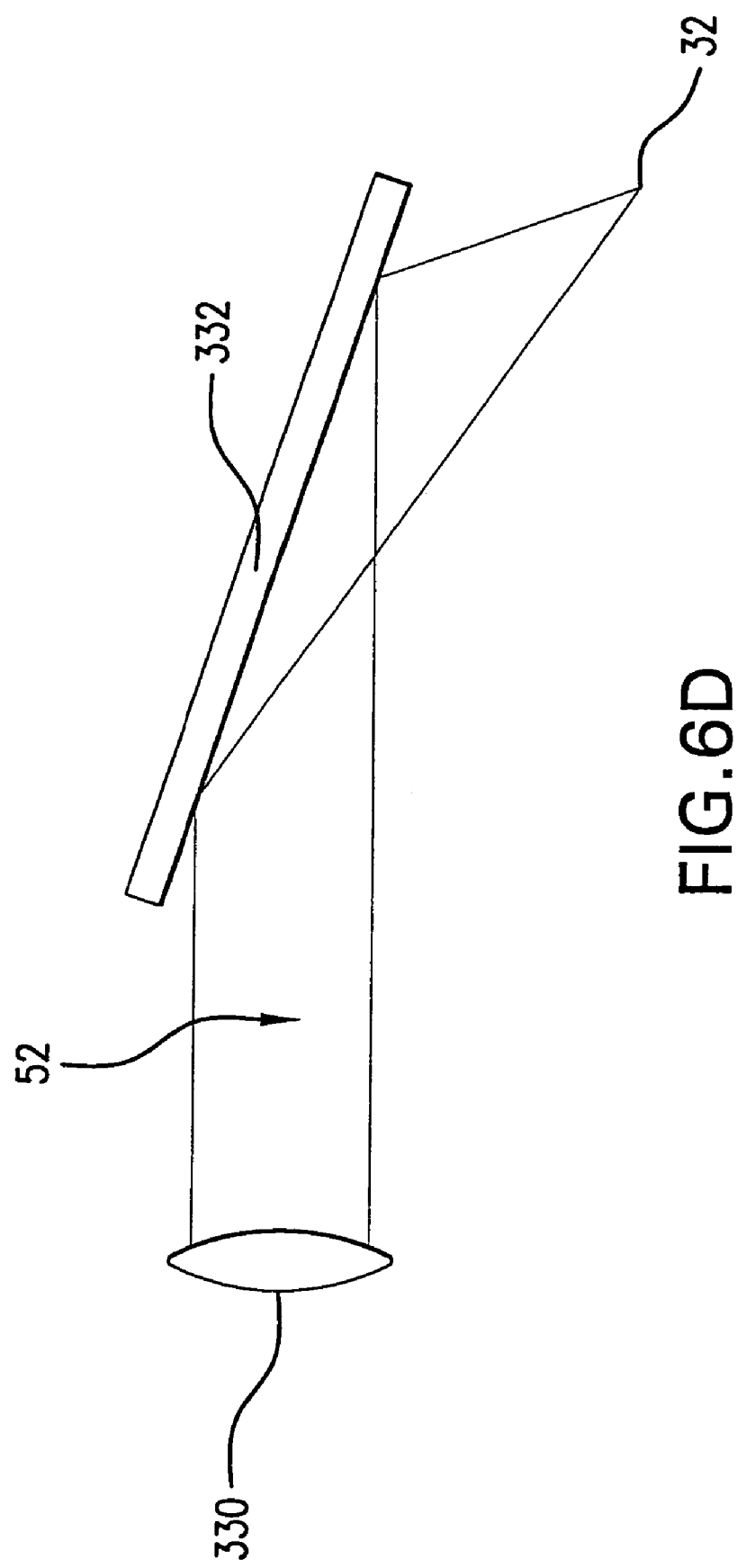

According to aspects of an embodiment of the present invention, illustrated in FIG. 6B a parabolic reflector surface 310 forming a reflector 300' shell may be used to focus the beam 52. As illustrated in FIG. 6C a combination of surfaces, e.g., ellipses in series or a Wolter reflector comprising a combination of a paraboloid 320, followed by a confocal and coaxial paraboloid 322 can be used to focus the beam 52 in the vicinity of the focus of the collector 40 (not shown in FIGS. 6A-D), i.e., at a selected plasma initiation site within the desired plasma initiation region. In FIG. 6D the beam 52 is passed through a flat or curved optic 330 and onto a flat or curved reflecting surface 332 to focus at the collector focus 32. For example for a curved optic 330, the, e.g., flat optic reflecting surface 332 is between the focal point of the optic 330 and the optic 330 itself and the flat optic 332 focuses on the collector focus 32. The flat optic 332 may be, e.g., a part of a conical laser beam input passage 570 (shown in FIG. 12).

Figure 10A:
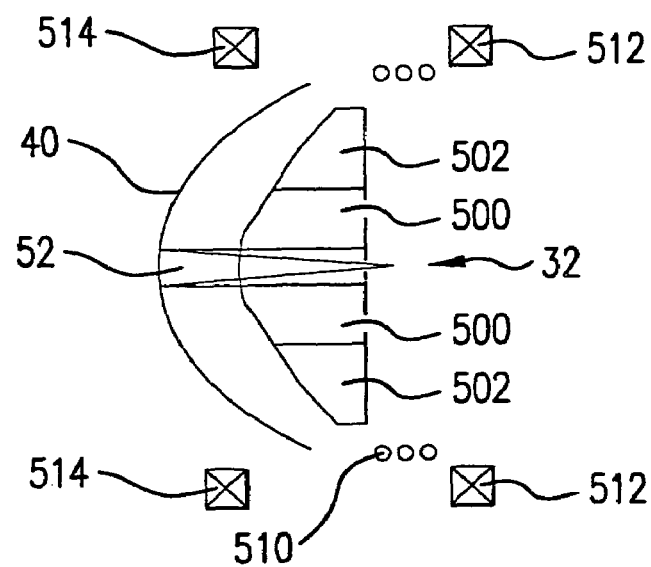
FIGS. 10A and 10B show schematically a collector with a three-dimensional physical debris shield according to aspects of an embodiment of the present invention.
Figure 10B:
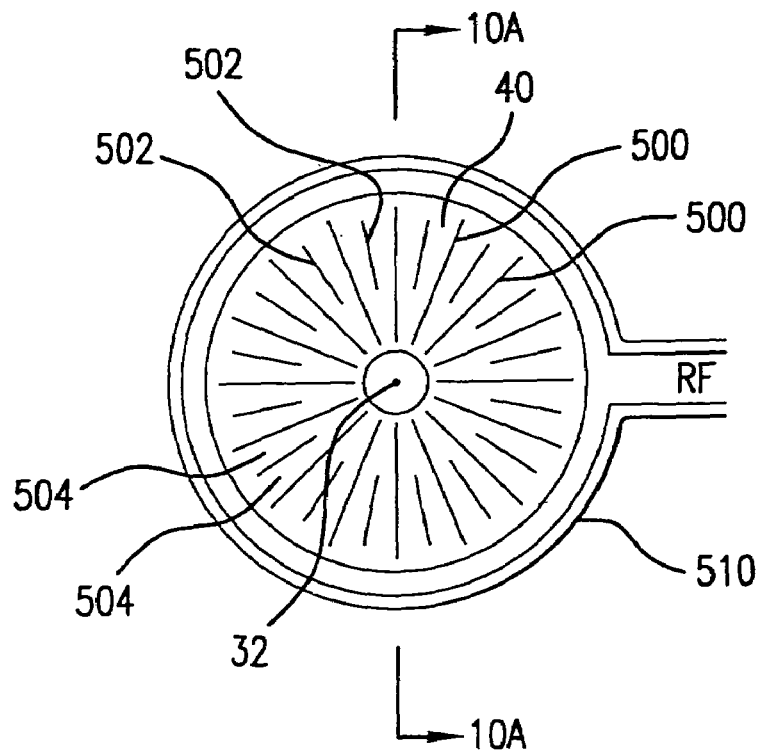

Turning now to FIGS. 10A and 10B there is shown, respectively, schematically a side cross-sectional view along cross sectional lines 10A in FIG. 10B, and a front view, of a collector 40 with a debris shield of the collector 40 and foil separators 500, 502 in the debris shield. By way of example the collector 40 may form an elliptical reflecting surface, symmetric about an axis of rotation with the foil separators 500, 502 of the debris shield intermediate a focus 32 of the elliptical reflecting surface. The foil separators 500, 502 may, e.g., comprise alternating long foil separators 500 that may extend essentially from the drive laser beam 52 opening in the collector 40 and debris shield to a radial extent of the debris shield, and short debris shield foil separators 502 that extend, e.g., from the radial extent to a position intermediate the radial extent and the drive laser beam 52 opening. The thin foil separators 500 may comprise foil sheets that are as thin as structurally possible and, together with the also thin as possible short foil sheets 502, may form light passages that are aligned with EUV ray paths from the focus 32 to the collector 40 reflecting surface and back to the intermediate focus 42. The intermixture of long foil sheets 500 and short foil sheets 502 may serve, e.g., to increase the light passage openings without significantly detracting from either structural integrity or the debris removal function of the foil sheets 500, 502. It is also contemplated that the foil sheets can be of multiple lengths, i.e., the short foil sheets may themselves be of different lengths and distributed in some pattern about the axis of revolution along with intervening long foils sheet separators or alternatively randomly so distributed.

It will be understood that the foil sheets 500, 502 may serve to plate out lithium or other target metal and/or compounds thereof, including compounds of impurities, e.g., introduced in the lithium target material, whether compounds with the target material itself or otherwise, that may otherwise reach the collector 40. The foil sheet separators 500, 502 may also have other debris mitigation impacts. Further incoming material, e.g., lithium and lithium ions may sputter material from the foil separator sheets 500, 502. The collector debris shield separator foil sheets 500, 502 may be heated to evaporate some of the materials plating out on the separator foil sheets 500, 502 after plating on the separator foils sheets 500, 502.

RF coils 510 may form a plasma barrier intermediate the debris shield and the plasma initiation at the focus 32 to, e.g., slow down and scatter, e.g., fast moving ions and/or debris of other forms, so that such ions or debris end up deposited on the foil sheets 500, 502. Magnetic fields creates by, e.g., steering magnets 512, 514, which may be permanent magnets or electro-magnets, may serve to steer, e.g., ions, induced by the LPP plasma or in the RF induced plasma in front of and/or in the area of the debris shield, to be turned away from the collector 40 and its sensitive multi-layer reflecting surfaces.

Figure 11:
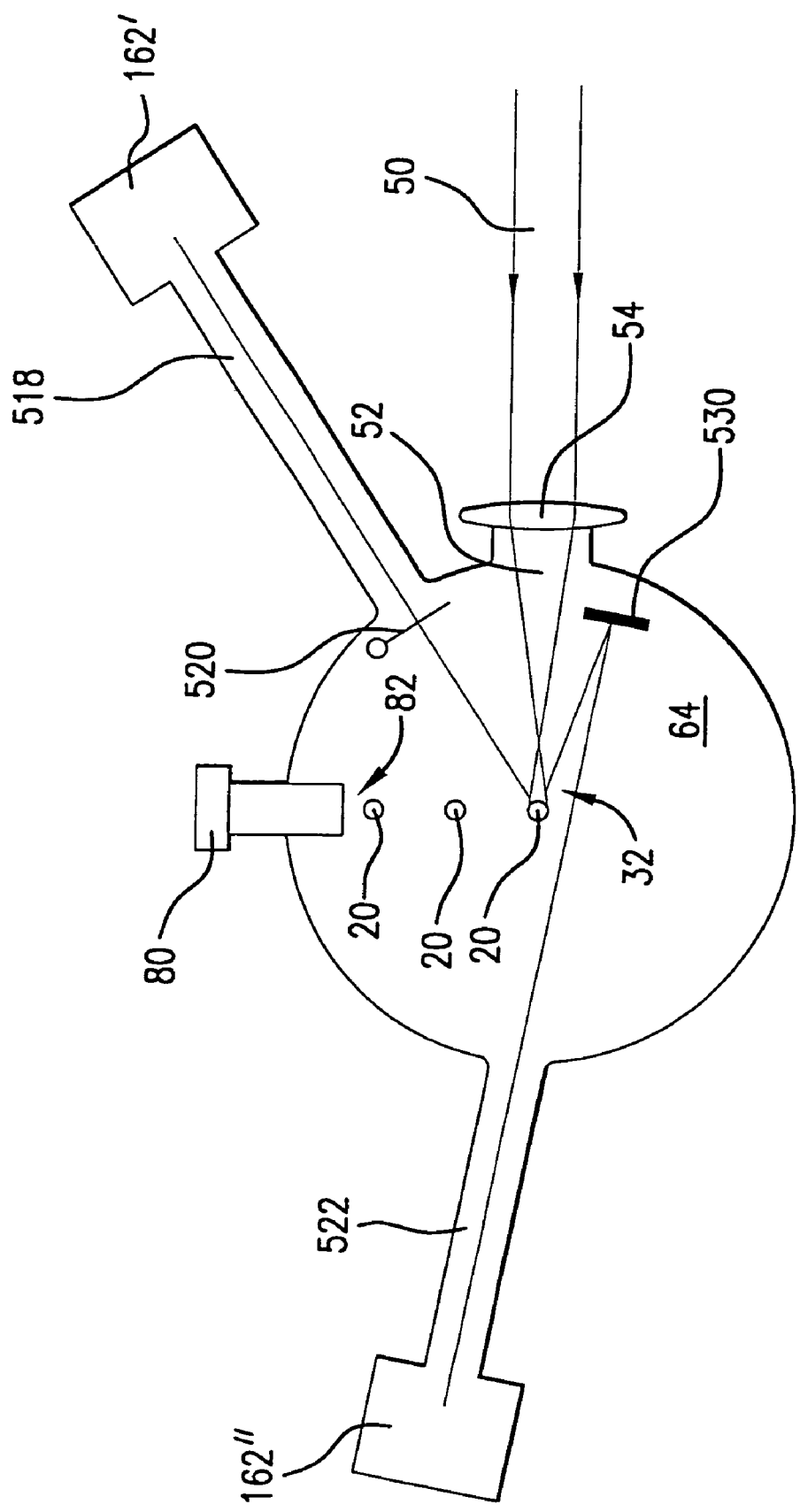
FIG. 11 shows schematically and in cross section a metrology system according to aspects of an embodiment of the present invention.

Turning now to FIG. 11 there is shown schematically and in cross-section an exemplary EUV energy detection system and collector efficiency metrology system that may comprise, e.g., an EUV power detector (power meter) 162' in an EUV reference measurement arm 518 which may, e.g., be intermittently exposed to EUV light, e.g., originating at the plasma initiation site in the desired plasma initiation region around the desired plasma initiation site 32, by the operation of a shutter 520. Also part of the EUV collector efficiency metrology system may be, e.g., a collector sample 530 disposed in the chamber 64 at a location that will not significantly block light passage from the collector 40 (not shown in FIG. 11) but positioned to receive plasma debris relatively in the same amounts as, e.g., the actual multi-layer reflecting surfaces on the collector 40, and, e.g., made of the same materials. The collector sample 530 may also be protected from debris in ways to simulate the same protections, if any, implemented to protect the actual collector 40 reflecting surfaces and/or calibrated in some fashion to account for the differences in debris exposure over that of the actual collector 40 reflecting surfaces.

It will be understood that the collector efficiency metrology system may operate by exposing the EUV power meter 162' in the EUV reference measurement arm 518 to the EUV emanating from the plasma at the plasma initiation site 32, e.g., by opening the shutter 520 and at the same time reading the EUV power meter 162 " at the end of the EUV measurement arm 522. This can, e.g., give the difference between the EUV generated at the plasma initiation site 32 and the EUV reflected from the collector sample 530 to the detector 162". This may, from the outset be different values due to, e.g., the reflectivity losses in the multi-reflective coatings on the collector sample 530, the same way that the collector itself reflects less than all of the light emitted from the plasma initiation site that reaches the collector 40 reflective surfaces. Over time, however, the change in this difference may reflect adverse impacts of the operation of, e.g., debris formation on, the collector 40. This may be utilized to calibrate other aspects of metrology measurements for the overall system, e.g., dependent upon collector 40 performance, e.g., EUV received at the IF or in the lithography tool, e.g., from the change(s) in time of the difference between the EUV light sensed at the EUV detector 162' and 162". It will be understood that the detector 162' may also serve as part of the arrays of detectors 162 shown in FIG. 1 as explained above to detect, e.g., the geometric balance of the EUV energy generated at the plasma initiation site 32 for purposes of detecting, e.g., drive laser mis-timing in irradiating a respective target, e.g., a respective target 20.

Figure 12:
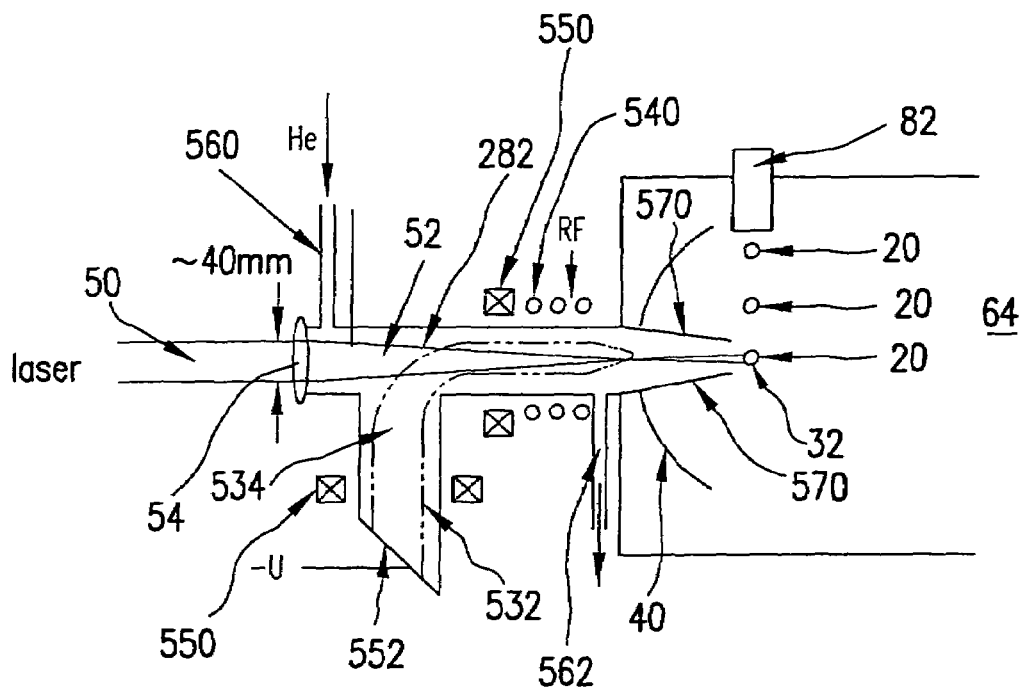
FIG. 12 shows schematically and in cross section an apparatus and method for protection of system optics from debris according to aspects of an embodiment of the present invention.

Turning now to FIG. 12 there is shown schematically and in cross section a form of debris management system to protect, e.g., the drive laser focusing optic, which may, e.g., form a drive laser input window 54 in a drive laser beam input passage 282. The drive beam input passage 282 may have surrounding it at one end toward the EUV plasma initiation site 32 a plasma formation mechanism, e.g., a plasma formation RF coil 540 which in operation may serve, e.g., to ionize or further ionize debris, e.g., plasma source medium, e.g., target metal, atoms and/or ions, e.g., lithium and lithium compound and lithium impurity compound, atoms and/or ions, that enter the laser beam input passage 282, e.g., through the drive laser beam opening in the collector. The ions, formed at the EUV plasma initiation site and/or formed or further energized in the plasma initiation RF field formed in the laser beam passage 282 by the RF coils 540, may then be steered by steering magnets 550. The RF field formed by the coils 540 also serves to slow ions entering the passage 282 from the EUV plasma initiation region. The steering magnets 550 may form a steering magnetic field that turns the plasma in the laser beam input passage 282 into a debris trap 532 extending at an angle, e.g., orthogonally to the laser beam input passage 282. The debris flow 534 so steered, may be incident upon, e.g., a charged plate 552 which may be negatively charged to some voltage –U to plate out the debris material contained in the debris flow 534.

Further enhancing the protection of, e.g., the optic formed by window/lens 54 may be, e.g., a flow of purge gas, e.g., helium, from a purge gas inlet 560 to a purge gas outlet 562 through the drive laser inlet passage 282. Alternatively, the purge gas may be exhausted into the chamber 64 through a conical laser beam inlet tube 570, as shown illustratively in FIG. 12, in lieu of the purge gas outlets 560 or in addition to the purge gas outlet 562.

Figure 13:
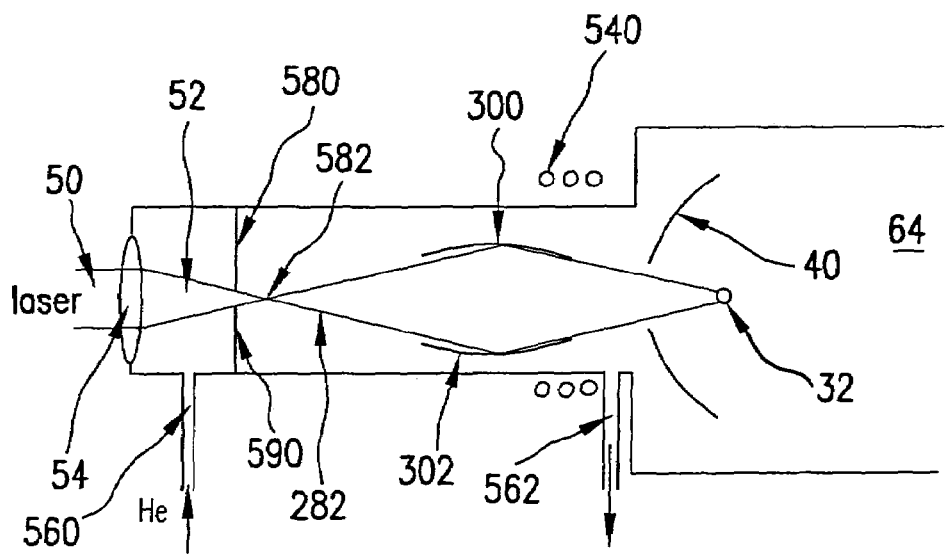
FIG. 13 shows schematically and in cross section an alternative embodiment to that of FIG. 12 according to aspects of an embodiment of the present invention.

Turning now to FIG. 13 there is shown schematically and in cross section another form of debris management system for the protection of, e.g., a window/lens 54 in the drive laser inlet passage 282. This system of FIG. 13 may comprise, e.g., a shield plate 580 having an aperture 582, through which the drive laser beam 52 may be focused on the way to, e.g., a drive laser focusing optic 300, in the drive laser input passage 282, with the purge gas inlet 560 on a drive laser beam input side of the shield plate 580 and the purge gas outlet 562 on a collector 40 side of the shield plate 580. The system of FIG. 13 may also have a debris plasma formation mechanism which may comprise, e.g., RF coils 540, which may serve to slow down ions entering the passage from the EUV plasma initiation region.

It will be understood that the plasma focusing optic 300 within the drive laser input passage 282 may serve, e.g., to refocus the drive laser beam 52 at the target plasma initiation site 32 so as to allow, e.g., a longer drive laser input passage, e.g., 1000 mm between the EUV plasma initiation site end of the drive laser inlet passage 282 and the shield plate 580, as opposed, e.g., to the 300 mm of the embodiment of FIG. 12 between the EUV plasma initiation end of the drive laser inlet passage 282 and the optic 54. This can enable, e.g., more dissipation and collection of the debris between the EUV plasma initiation site 32 end of the drive laser beam inlet passage 282 and the shield plate 580, keeping the debris at the aperture 582 at a minimum and facilitating the purge gas flow through the aperture 582 in blocking the passage of debris through the aperture 582. The aperture 582 may have an opening of about 1 mm and be placed at the focal point of the optic 54. Laser beam 56 is then focused by the optic 54 into a focal point 590 near the orifice of the aperture 582. Mirrors 302 then refocus the beam 54 into the plasma initiation site 32. The side walls of the drive laser inlet passage 282 may be kept at a negative voltage and/or a magnetic field(s) may be used to encourage the debris to flow to and deposit on the interior walls of the drive laser inlet passage 282 intermediate the EUV plasma initiation site end of the passage 282 and the shield plate 580.

The drive laser focusing optic 300 may also be heated electrically by an electrical connection(not shown) in addition to any RF heating from the coils 540, and, being reflective to, e.g., DUV of the drive laser beam 52, but not EUV, even at a grazing angle of incidence, will not focus EUV or debris back to the aperture 580. The laser focusing optic 300 may have metal mirrors 302.

It will be understood by those skilled in the art that an apparatus and method is described which may comprise a plasma produced extreme ultraviolet ("EUV") light source multilayer collector which may comprise a plasma formation chamber; a shell within the plasma formation chamber in the form of a collector shape having a focus; the shell having a sufficient size and thermal mass to carry operating heat away from the multilayer reflector and to radiate the heat from the surface of the shell on a side of the shell opposite from the focus. The material of the shell may comprise a material selected from a group which may comprise silicon carbide, silicon, Zerodur or ULE glass, aluminum, beryllium, molybdenum, copper and nickel. The apparatus and method may comprise at least one radiative heater directed at the shell to maintain the steady state temperature of the shell within a selected range of operating temperatures. The temperatures within the range of temperatures may be sufficient to evaporate plasma generation target material from an outer surface of the collector. The apparatus and method may comprise a heat sink adjacent the shell on the side of the shell opposite from the focus absorbing heat radiated from the facing surface of the shell. The heat sink may form a part of a heat exchanger transferring heat to a heat transfer fluid supplied from external to the chamber. The method and apparatus may comprise the method of producing a plasma produced extreme ultraviolet ("EUW") light source comprising utilizing a collector which may comprise a plasma formation chamber; a shell within the plasma formation chamber in the form of a collector shape having a focus; a multilayer stack forming a normal angle of incidence reflector or a grazing angle of incidence reflector in physical and thermal communication with the shell on a side of the shell facing the focus; and including in the shell a sufficient size and thermal mass to carry operating heat away from the multilayer reflector and to radiate the heat from the surface of the shell on a side of the shell opposite from the focus. The apparatus and method may comprise a plasma produced extreme ultraviolet ("EUV") light source collector which may comprise a plasma formation chamber; a shell within the plasma formation chamber in the form of a collector shape having a focus; a multilayer stack forming a normal angle of incidence reflector or a grazing angle of incidence reflector in physical and thermal communication with the shell on a side of the shell facing the focus; a heat sink adjacent the shell on the side of the shell opposite from the focus in radiative thermal communication with the shell. The shell may comprise a substrate for the multilayer stack. The shell may have a sufficient size and thermal mass to carry operating heat away from the multilayer reflector and to radiate the heat from the surface of the shell on a side of the shell opposite from the focus. The apparatus and method may comprise a heating element intermediate the shell and the heat sink. The heating element may comprise a zonal heater differentially heating the shell.

We claim:

1. An apparatus comprising:
a plasma produced extreme ultraviolet ("EUV") light source multilayer collector comprising:
a plasma formation chamber;
a shell within the plasma formation chamber in the form of a collector shape having a focus;
the shell having a sufficient size and thermal mass to carry operating heat away from the multilayer reflector and to radiate the heat from the surface of the shell on a side of the shell opposite from the focus.

2. The apparatus of claim 1 further comprising:
the material of the shell comprises a material selected from a group comprising:
silicon carbide, silicon, Zerodur or ULE glass, aluminum, beryllium, molybdenum, copper and nickel.

3. The apparatus of claim 2 further comprising:
at least one radiative heater directed at the shell to maintain the steady state temperature of the shell within a selected range of operating temperatures.

4. The apparatus of claim 3 further comprising:
the temperatures within the range of temperatures are sufficient to evaporate plasma generation target material from an outer surface of the collector.

5. The apparatus of claim 4 further comprising:
a heat sink adjacent the shell on the side of the shell opposite from the focus absorbing heat radiated from the facing surface of the shell.

6. The apparatus of claim 5 further comprising:
the heat sink forms a part of a heat exchanger transferring heat to a heat transfer fluid supplied from external to the chamber.

7. The apparatus of claim 3 further comprising:
a heat sink adjacent the shell on the side of the shell opposite from the focus absorbing heat radiated from the facing surface of the shell.

8. The apparatus of claim 7 further comprising:
the heat sink forms a part of a heat exchanger transferring heat to a heat transfer fluid supplied from external to the chamber.

9. The apparatus of claim 2 further comprising:
a heat sink adjacent the shell on the side of the shell opposite from the focus absorbing heat radiated from the facing surface of the shell.

10. The apparatus of claim 9 further comprising:
the heat sink forms a part of a heat exchanger transferring heat to a heat transfer fluid supplied from external to the chamber.

11. The apparatus of claim 1 further comprising:
at least one radiative heater directed at the shell to maintain the steady state temperature of the shell within a selected range of operating temperatures.

12. The apparatus of claim 11 further comprising:
the temperatures within the range of temperatures are sufficient to evaporate plasma generation target material from an outer surface of the collector.

13. The apparatus of claim 12 further comprising:
a heat sink adjacent the shell on the side of the shell opposite from the focus absorbing heat radiated from the facing surface of the shell.

14. The apparatus of claim 13 further comprising:
the heat sink forms a part of a heat exchanger transferring heat to a heat transfer fluid supplied from external to the chamber.

15. The apparatus of claim 11 further comprising:
a heat sink adjacent the shell on the side of the shell opposite from the focus absorbing heat radiated from the facing surface of the shell.

16. The apparatus of claim 15 further comprising:
the heat sink forms a part of a heat exchanger transferring heat to a heat transfer fluid supplied from external to the chamber.

17. The apparatus of claim 1 further comprising:
a heat sink adjacent the shell on the side of the shell opposite from the focus absorbing heat radiated from the facing surface of the shell.

18. The apparatus of claim 17 further comprising:
the heat sink forms a part of a heat exchanger transferring heat to a heat transfer fluid supplied from external to the chamber.

19. A method comprising
the method of producing a plasma produced extreme ultraviolet ("EUV") light source comprising utilizing a collector comprising:
a plasma formation chamber;
a shell within the plasma formation chamber in the form of a collector shape having a focus;
a multilayer stack forming a normal angle of incidence reflector or a grazing angle of incidence reflector in physical and thermal communication with the shell on a side of the shell facing the focus; and
including in the shell a sufficient size and thermal mass to carry operating heat away from the multilayer reflector and to radiate the heat from the surface of the shell on a side of the shell opposite from the focus.

20. An apparatus comprising
a plasma produced extreme ultraviolet ("EUV") light source collector comprising:
a plasma formation chamber;
a shell within the plasma formation chamber in the form of a collector shape having a focus;
a multilayer stack forming a normal angle of incidence reflector or a grazing angle of incidence reflector in physical and thermal communication with the shell on a side of the shell facing the focus;
a heat sink adjacent the shell on the side of the shell opposite from the focus in radiative thermal communication with the shell.

21. The apparatus of claim 20 further comprising:
the shell comprises a substrate for the multilayer stack.
22. The apparatus of claim 21 further comprising:
the shell having a sufficient size and thermal mass to carry operating heat away from the multilayer reflector and to radiate the heat from the surface of the shell on a side of the shell opposite from the focus.
23. The apparatus of claim 22 further comprising:
a heating element intermediate the shell and the heat sink.
24. The apparatus of claim 23 further comprising:
the heating element comprises a zonal heater differentially heating the shell.
25. The apparatus of claim 21 further comprising:
a heating element intermediate the shell and the heat sink.
26. The apparatus of claim 25 further comprising:
the heating element comprises a zonal heater differentially heating the shell.
27. The apparatus of claim 20 further comprising:
the shell having a sufficient size and thermal mass to carry operating heat away from the multilayer reflector and to radiate the heat from the surface of the shell on a side of the shell opposite from the focus.
28. The apparatus of claim 27 further comprising:
a heating element intermediate the shell and the heat sink.
29. The apparatus of claim 28 further comprising:
the heating element comprises a zonal heater differentially heating the shell.
30. The apparatus of claim 20 further comprising:
a heating element intermediate the shell and the heat sink.
31. The apparatus of claim 30 further comprising:
the heating element comprises a zonal heater differentially heating the shell.

* * * * *